(12) United States Patent
Chung et al.

(10) Patent No.: US 8,054,248 B2
(45) Date of Patent: Nov. 8, 2011

(54) METHOD AND APPARATUS FOR DRIVING PLASMA DISPLAY PANEL

(75) Inventors: Moon Shick Chung, Kumi-shi (KR); Jeong Pil Choi, Suwon (KR)

(73) Assignee: LG Electronics Inc., Seoul (KR)

( * ) Notice: Subject to any disclaimer, the term of this patent is extended or adjusted under 35 U.S.C. 154(b) by 762 days.

(21) Appl. No.: 11/958,455

(22) Filed: Dec. 18, 2007

(65) Prior Publication Data

US 2008/0122745 A1 May 29, 2008

(51) Int. Cl.
*G09G 3/28* (2006.01)

(52) U.S. Cl. .............. 345/60; 345/63; 345/65; 345/66; 345/67; 345/69

(58) Field of Classification Search .......... 345/36, 345/60–69, 204, 208, 50, 209; 315/169.1–169.4
See application file for complete search history.

(56) References Cited

U.S. PATENT DOCUMENTS

| | | | |
|---|---|---|---|
| 6,340,960 B1 * | 1/2002 | Song et al. ............. 345/60 |
| 6,356,261 B1 * | 3/2002 | Kim ................... 345/209 |
| 6,492,776 B2 | 12/2002 | Rutherford |
| 6,525,486 B2 * | 2/2003 | Awamoto et al. ....... 315/169.4 |
| 6,525,701 B1 * | 2/2003 | Kang ................... 345/60 |
| 6,680,717 B2 | 1/2004 | Tanaka |
| 6,774,872 B1 * | 8/2004 | Kawada et al. ......... 345/60 |
| 6,833,823 B2 | 12/2004 | Sakita |
| 6,995,735 B2 | 2/2006 | Mizobata |
| 7,075,239 B2 * | 7/2006 | Kang et al. ........... 315/169.3 |
| 7,333,075 B2 * | 2/2008 | Chung et al. ........... 345/60 |
| 2002/0021265 A1 | 2/2002 | Ishii et al. |
| 2003/0001512 A1 * | 1/2003 | Awamoto et al. ....... 315/169.3 |
| 2003/0090441 A1 * | 5/2003 | Kim et al. ............. 345/60 |
| 2003/0169216 A1 * | 9/2003 | Chung et al. ........... 345/60 |
| 2003/0201726 A1 * | 10/2003 | Kang et al. ........... 315/169.1 |
| 2005/0179621 A1 * | 8/2005 | Kang et al. ........... 345/60 |
| 2008/0122745 A1 * | 5/2008 | Chung et al. ........... 345/60 |

FOREIGN PATENT DOCUMENTS

| | | |
|---|---|---|
| JP | 09-179520 | 7/1997 |
| JP | 11-065516 | 3/1999 |
| JP | 11-242460 | 9/1999 |
| JP | 2000-039865 | 2/2000 |

(Continued)

OTHER PUBLICATIONS

Japanese Office Action dated Aug. 12, 2008.

(Continued)

*Primary Examiner* — Prabodh Dharia
(74) *Attorney, Agent, or Firm* — KED & Associates, LLP

(57) ABSTRACT

A driving method of a plasma display panel may be provided such that the plasma display panel may be driven stably under a high temperature environment. The method may include applying a scan pulse to the scan electrode during an address period, applying a first DC voltage to the sustain electrode during the set-down period, applying a second DC voltage to the sustain electrode during the first address period after applying the falling waveform to the scan electrode, and applying a third DC voltage to the sustain electrode during the second address period after applying the second DC voltage to the sustain electrode. A difference between the second DC voltage and a lowest voltage of the scan pulse applied during the first address period is lower than a difference between the third DC voltage and a lowest voltage of the scan pulse applied during the second address period.

33 Claims, 19 Drawing Sheets

FOREIGN PATENT DOCUMENTS

| | | |
|---|---|---|
| JP | 2000-330511 | 11/2000 |
| JP | 2001-005424 | 1/2001 |
| JP | 2001-013915 | 1/2001 |
| JP | 2001-117532 | 4/2001 |
| JP | 2001-125534 | 5/2001 |
| JP | 2001-236038 | 8/2001 |
| JP | 2001-255848 | 9/2001 |
| JP | 2001-272949 | 10/2001 |
| JP | 2002-014652 | 1/2002 |
| JP | 2002-140032 | 5/2002 |
| JP | 2002-351391 | 12/2002 |
| KR | 20000034676 | 6/2000 |
| KR | 2000-0053573 | 8/2000 |

OTHER PUBLICATIONS

Japanese Office Action dated Nov. 20, 2007.
Korean Office Action.

* cited by examiner

METHOD AND APPARATUS FOR DRIVING PLASMA DISPLAY PANEL

The present application claims priority from U.S. patent application Ser. No. 10/387,617, filed Mar. 5, 2003 (now U.S. Pat. No. 7,333,075), which claims priority from Korean Application No. 12001/2002, filed Mar. 6, 2002, the subject matters of which are incorporated herein by reference.

BACKGROUND OF THE INVENTION

1. Field of the Invention

The present invention relates to a plasma display panel, and more particularly to a driving method and apparatus for a plasma display panel that can be driven stably under a high temperature environment.

2. Description of the Related Art

A plasma display panel PDP displays a picture by having an ultraviolet ray make light emitted from a phosphorus material, the ultraviolet ray is generated when inert mixture gas is discharged. The PDP has its picture quality improved in debt to recent technology development as well as being easy to be made thin in thickness and big in size.

Referring to FIG. 1, a discharge cell of a three electrode AC surface discharge PDP includes a pair of sustain electrodes having a scan electrode 30Y and a common sustain electrode 30Z formed on an upper substrate 10, and an address electrode 20X formed on a lower substrate 18 to cross the pair of sustain electrodes perpendicularly. The sustain electrode 30Y and the sustain electrode 30Y each has a structure where transparent electrodes 12Y and 12Z and metal bus electrodes 13Y and 13Z are deposited. There are an upper dielectric layer 14 and an MgO passivation film 16 deposited on the upper substrate 10 where the scan electrode 30Y and the sustain electrode 30Z.

There are lower dielectric layer 22 and barrier ribs 24 formed on the lower substrate 18 where the address electrode 20X is formed. There is a fluorescent layer 26 spread on the lower dielectric layer 22 and surface of the barrier ribs 24.

There is inert gas such as He+Xe, Ne+Xe and He+Xe+Ne etc. interposed in a discharge space provided between the upper/lower substrates 10 and 18 and the barrier ribs 24.

In order to realize the gray level of a picture, the PDP is time-division driven by dividing one frame into several sub-fields that have their light emission frequencies different. Each sub field can be divided into an initialization period (or a reset period) to initialize a full screen, an address period to select scan lines and select cells among the selected scan lines, and a sustain period to realize gray levels in accordance with a discharge frequency. The initialization period is again divided into a setup period for which a rising ramp waveform is applied and a set-down period for which a falling ramp waveform is applied. For example, in the event of displaying a picture with 256 gray levels, the frame period (16.67 ms) corresponding to 1/60 second as in FIG. 2 is divided into 8 sub-fields (SF1 to SF8).

Each of the 8 sub-fields (SF1 to SF8), as described above, is divided into the initialization period, the address period and the sustain period. The initialization period and the address period of each sub-field are the same for each sub-field, while the sustain period increases at the rate of 2n (n=0, 1, 2, 3, 4, 5, 6, 7) in each sub-field.

FIG. 3 illustrates a driving waveform of a PDP which is applied to two sub-fields.

In FIG. 3, Y represents a scan electrode, Z does a sustain electrode and X does an address electrode.

Referring to FIG. 3, the PDP is driven by being divided into an initialization period to initialize a full screen, an address period to select cells and a sustain period to sustain discharges of the selected cells.

In the initialization period, a rising ramp waveform Ramp-up is simultaneously applied to all scan electrodes Y for a setup period SU. The rising ramp waveform Ramp-up causes a discharge to occur within the cells of the full screen. The setup discharge causes positive wall charges to be accumulated in the address electrode X and the sustain electrode Z, and negative wall charges to be accumulated in the scan electrode Y. A falling ramp waveform Ramp-down is simultaneously applied to the scan electrodes Y for the set-down period after the rising ramp waveform Ramp-up being applied. Herein, the falling ramp waveform begins to fall at the positive voltage lower than the peak voltage of the rising ramp waveform Ramp-up.

The falling ramp waveform Ramp-down causes a weak erasure discharge within the cells so as to eliminate the wall charges formed excessively. The wall charges are uniformly sustained within the cells so that an address discharge can be stably caused by the set-down discharge.

In the address period, negative scan pulses SCAN are sequentially applied to the scan electrodes Y and at the same time positive data pulses DATA synchronized with the scan pulses SCAN are applied to the address electrodes X. When the voltage difference between the scan pulse SCAN and the data pulse DATA is added to the wall voltages generated in the initialization period, the address discharge is generated within the cell to which the data pulse DATA is applied. When sustain voltages are applied, wall charges are formed within the cells selected by the address discharge so that the discharge can be caused.

Positive DC voltage Zdc is applied to the sustain electrode Z for the set-down period and the address period. The DC voltage Zdc sets the voltage difference between the sustain electrode Z and the scan electrode Y or the sustain electrode Z and the address electrode X so as to cause the set-down discharge to occur between the sustain electrode Z and the scan electrode Y for the set-down period, and at the same time so as not to cause a discharge to be generated on a large scale between the scan electrode Y and the sustain electrode Z for the address period.

In the sustain period, sustain pulses SUS are alternately applied to the scan electrodes Y and the sustain electrodes Z. In the cells selected by the address discharge, there occurs a sustain discharge, i.e., display discharge, between the scan electrode Y and the sustain electrode Z whenever each sustain pulse SUS is applied as the wall voltage within the cell is added to the sustain pulse SUS.

Lastly, after completion of the sustain discharge, a ramp waveform ERASE with narrow pulse width and low voltage level is applied to the sustain electrode Z, thereby to erase the wall charges remaining behind within the cells of the full screen.

However, the prior art PDP has a problem that the driving is not stable, i.e., there is no discharge generated in the event that it is made to run in a high temperature environment. For instance, in a high temperature environment of 50° C. or more, when the PDP, as in FIG. 4, is divided into an upper part and a lower part so that the upper part is scanned from top downward and the lower part is scanned from bottom upward, there occurs no address discharge in a middle part 41 where it is scanned late in order. If no address discharge is generated with respect to the selected cell, because the sustain discharge is not generated in the selected cell though the sustain voltage is applied, thus it is not possible to display a picture. In the same way, when the PDP is sequentially scanned from the first line till the last line as in FIG. 5 in the high temperature of 50° C. or more, there occurs no address discharge in a lower part 51 of the screen, which is scanned late in order.

Upon the high temperature environment experiment and the analysis result thereof, the principal cause for the occurrence of mis-discharge under the high temperature environment is the scanning order, as it gets later, the amount of loss of the wall charges generated in the initialization period is increased. To describe this cause on the basis of the discharge characteristic within the cell, firstly, as the internal/external temperature of the cell increases, the insulation characteristic of a dielectric material and a passivation material within the cell is deteriorated to generate leakage current, thereby leaking the wall charges. More specifically, in the event that the wall charges of the scan electrode Y and the sustain electrode Z is made to leak, it is easy for the address discharge to be mis-discharged. Secondly, as the movement of the space charge within the cell generated by the discharge in the high temperature environment gets active, the space discharge is easily recombined with the atom that has lost electrons so that the wall charges and space charges contributing to the discharge are lost as time passes by.

SUMMARY OF THE INVENTION

Accordingly, it is an object of the present invention to provide a driving method and apparatus for a plasma display panel that can be driven stably under a high temperature environment.

In order to achieve these and other objects of the invention, a method for driving a plasma display panel according to an aspect of the present invention, wherein the plasma display panel includes a plurality of scan electrodes, a plurality of sustain electrodes and a plurality of address electrodes, the method includes steps of increasing a voltage, which is applied to at least one of the scan electrode and the sustain electrode, in accordance with their scanning order; and selecting a cell by applying data to the address electrode.

Herein, the voltage applied to at least one of the scan electrode and the sustain electrode increases as the scanning order gets later.

Herein, the high temperature is 50° C. or more.

In the step of increasing the voltage, the voltage applied to the sustain electrode is increased linearly as the scanning order gets later.

The method further includes a step of continuously applying a rising ramp waveform and a falling ramp waveform to the scan electrode to initialize the cells of a full screen.

Herein, the falling ramp waveform falls down to a designated negative voltage.

The step of increasing the voltage further includes steps of applying a designated positive voltage to the sustain electrode while the falling ramp waveform is applied to the scan electrode; and applying to the sustain electrode a voltage that rises linearly from a lower voltage level than the positive voltage.

In the step of increasing the voltage, a second positive voltage higher than the positive voltage is applied to the sustain electrode that comes late in scanning order after applying a designated positive voltage to the sustain electrode that comes early in scanning order.

The step of increasing the voltage further includes steps of applying a designated positive voltage to the sustain electrode while the falling ramp waveform is applied to the scan electrode; and applying a third positive voltage lower than the positive voltage to the sustain electrode that comes early in scanning order, and then applying a fourth positive voltage higher than the third positive voltage to the sustain electrode that comes late in scanning order.

An apparatus for driving a plasma display panel under a high temperature environment according to the another aspect of the present invention, wherein the plasma display panel includes a plurality of scan electrodes, a plurality of sustain electrodes and a plurality of address electrodes, the apparatus includes a scan driver for applying a scan voltage to the scan electrode; a sustain driver for applying a voltage to the sustain electrode, the voltage is increased in accordance with a scanning order; and a data driver for applying data to the address electrode to select a cell.

Herein, the sustain driver increases the voltage applied to the sustain electrode as the scanning order gets later.

Herein, the high temperature is 50° C. or more.

Herein, the sustain driver increases the voltage applied to the sustain electrode linearly as the scanning order gets later.

Herein, the scan driver initialize the cells of a full screen by continuously applying a rising ramp waveform and a falling ramp waveform to the scan electrode.

Herein, the scan driver makes the falling ramp waveform fall down to a designated negative voltage.

Herein, the sustain driver applies a designated positive voltage to the sustain electrode while the falling ramp waveform is applied to the scan electrode, and applies to the sustain electrode a voltage that rises linearly from a lower voltage level than the positive voltage.

Herein, the sustain driver applies a second positive voltage higher than the positive voltage to the sustain electrode that comes late in scanning order after applying a designated positive voltage to the sustain electrode that comes early in scanning order.

Herein, the sustain driver applies a designated positive voltage to the sustain electrode while the falling ramp waveform is applied to the scan electrode, and applies a fourth positive voltage higher than the third positive voltage to the sustain electrode that comes late in scanning order after applying a third positive voltage lower than the positive voltage to the sustain electrode that comes early in scanning order.

An apparatus for driving a plasma display panel under a high temperature environment according to still another aspect of the present invention, wherein the plasma display panel includes a plurality of scan electrodes, a plurality of sustain electrodes and a plurality of address electrodes, the apparatus includes a scan driver for applying a scan voltage to the scan electrode, the scan voltage is increased in accordance with a scanning order; a sustain driver for applying a voltage to the sustain electrode, the voltage is increased in accordance with a scanning order; and a data driver for applying data to the address electrode to select a cell.

Herein, the scan driver increases the scan voltage as the scanning order gets later.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 1:
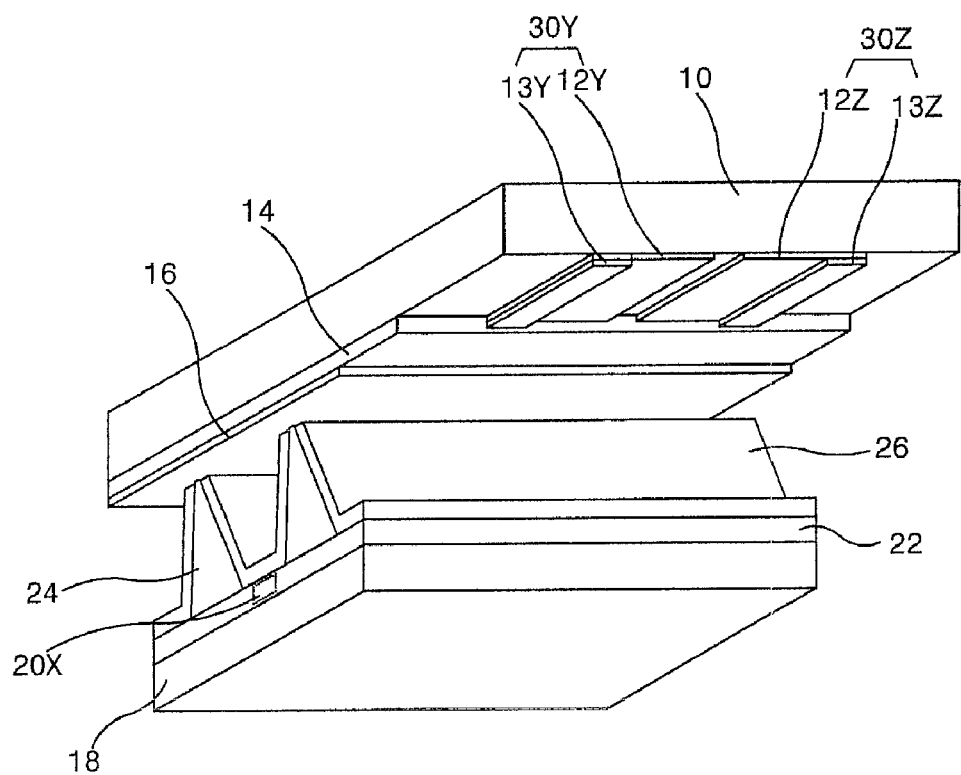
FIG. 1 is a perspective view representing a discharge cell structure of a conventional three electrode AC surface discharge PDP.
Figure 2:
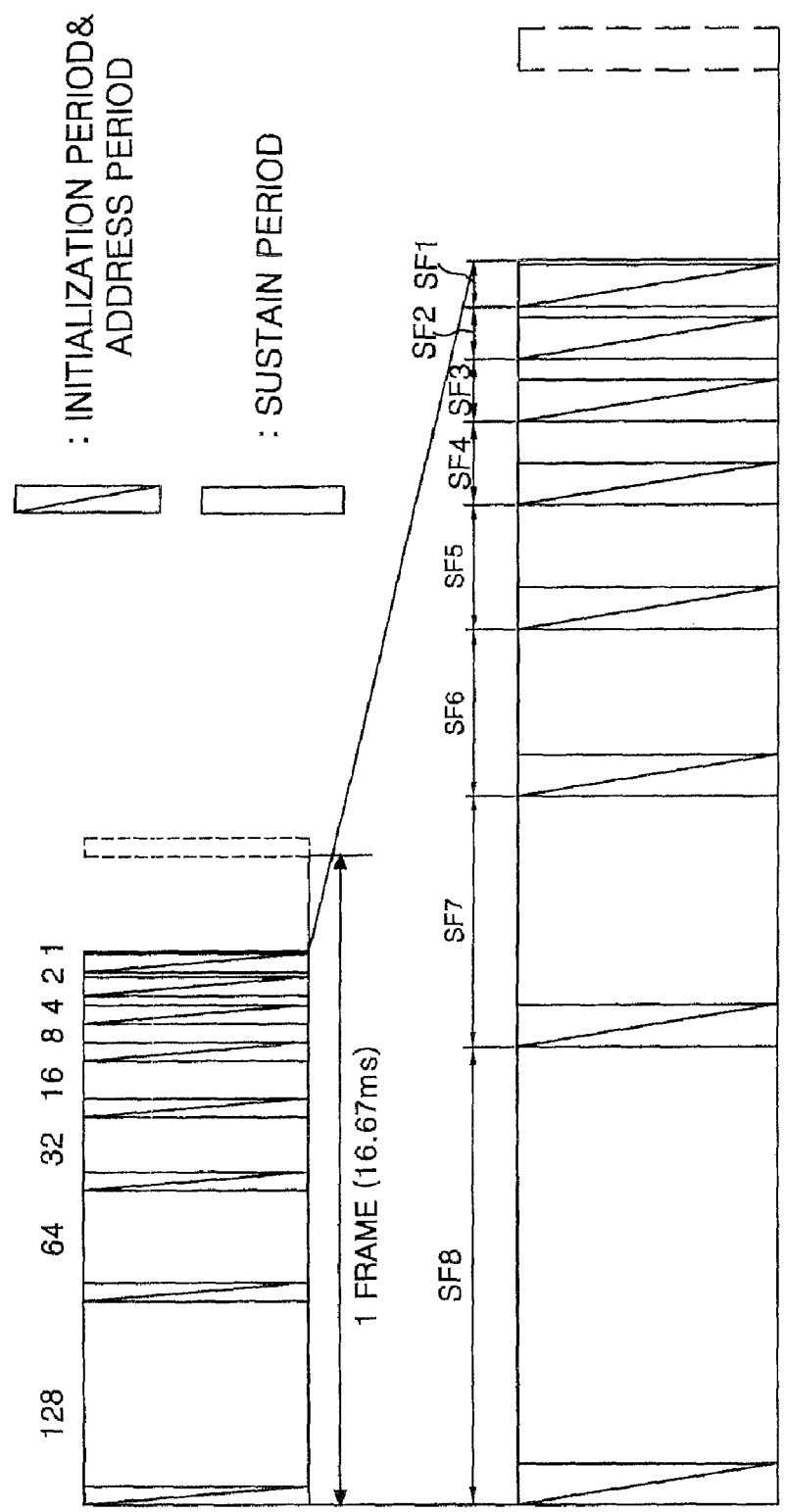
FIG. 2 illustrates a frame configuration of an 8 bit default code for realizing 256 gray levels.
Figure 3:
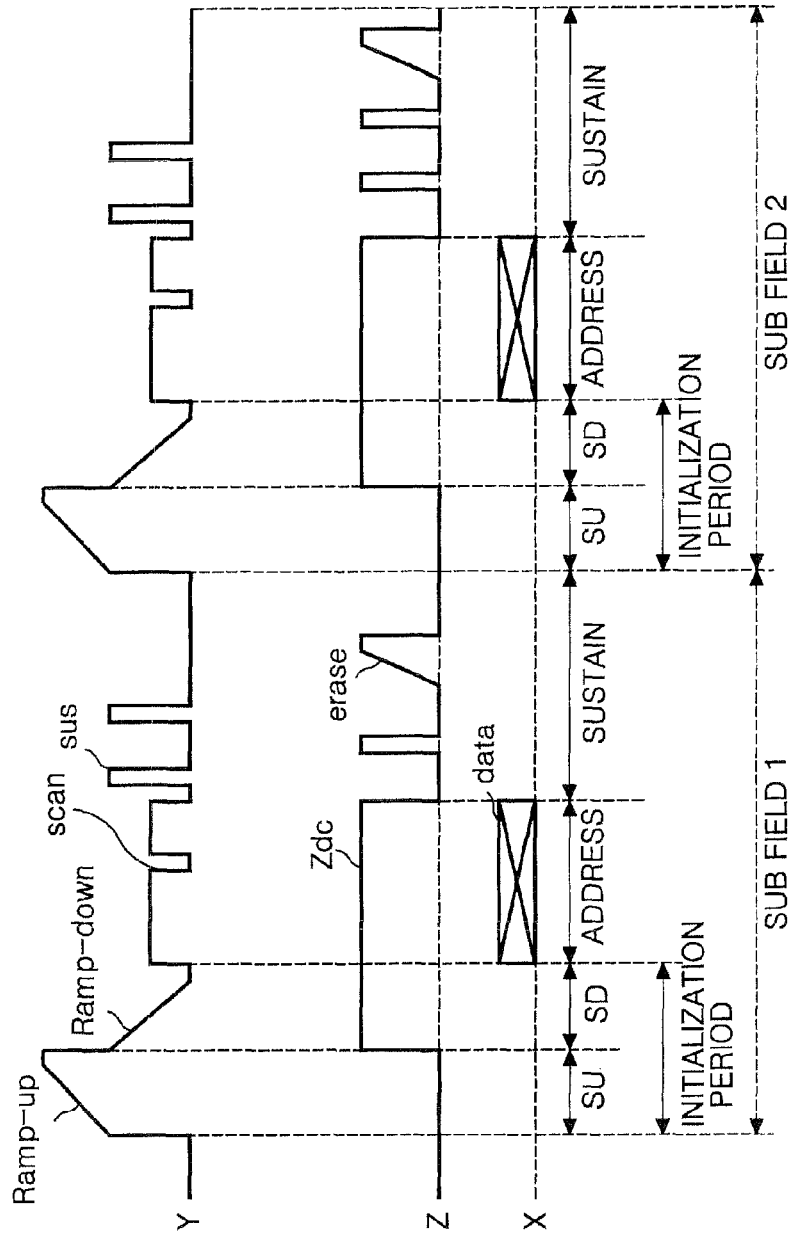
FIG. 3 illustrates a driving waveform for driving a conventional PDP.
Figure 4:
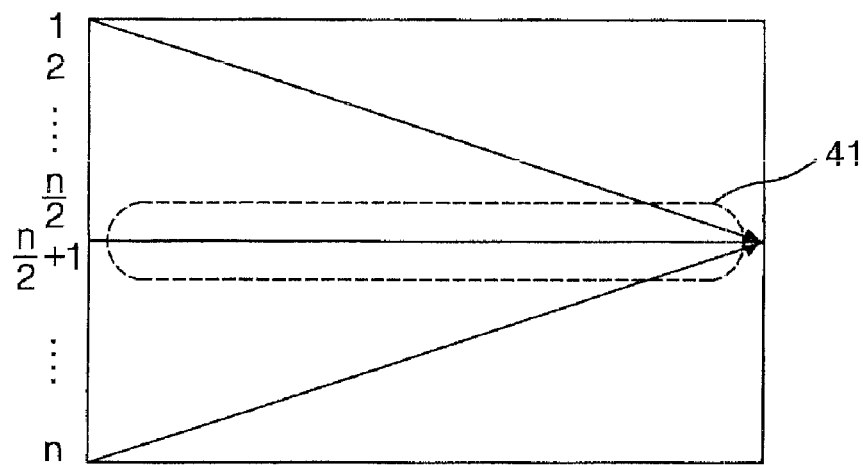
FIG. 4 is a diagram briefly representing the area where mis-discharge occurs under a high temperature environment, in the event that a PDP is divided into an upper part and a lower part and the upper and lower parts are scanned at the same time.
Figure 5:
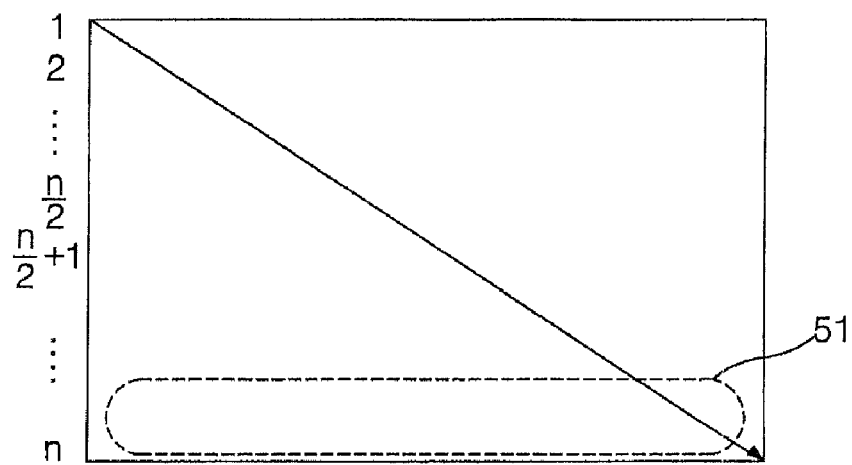
FIG. 5 is a diagram briefly representing the area where mis-discharge occurs under a high temperature environment, in the event that a PDP is sequentially scanned from the first line to the last line.
Figure 6:
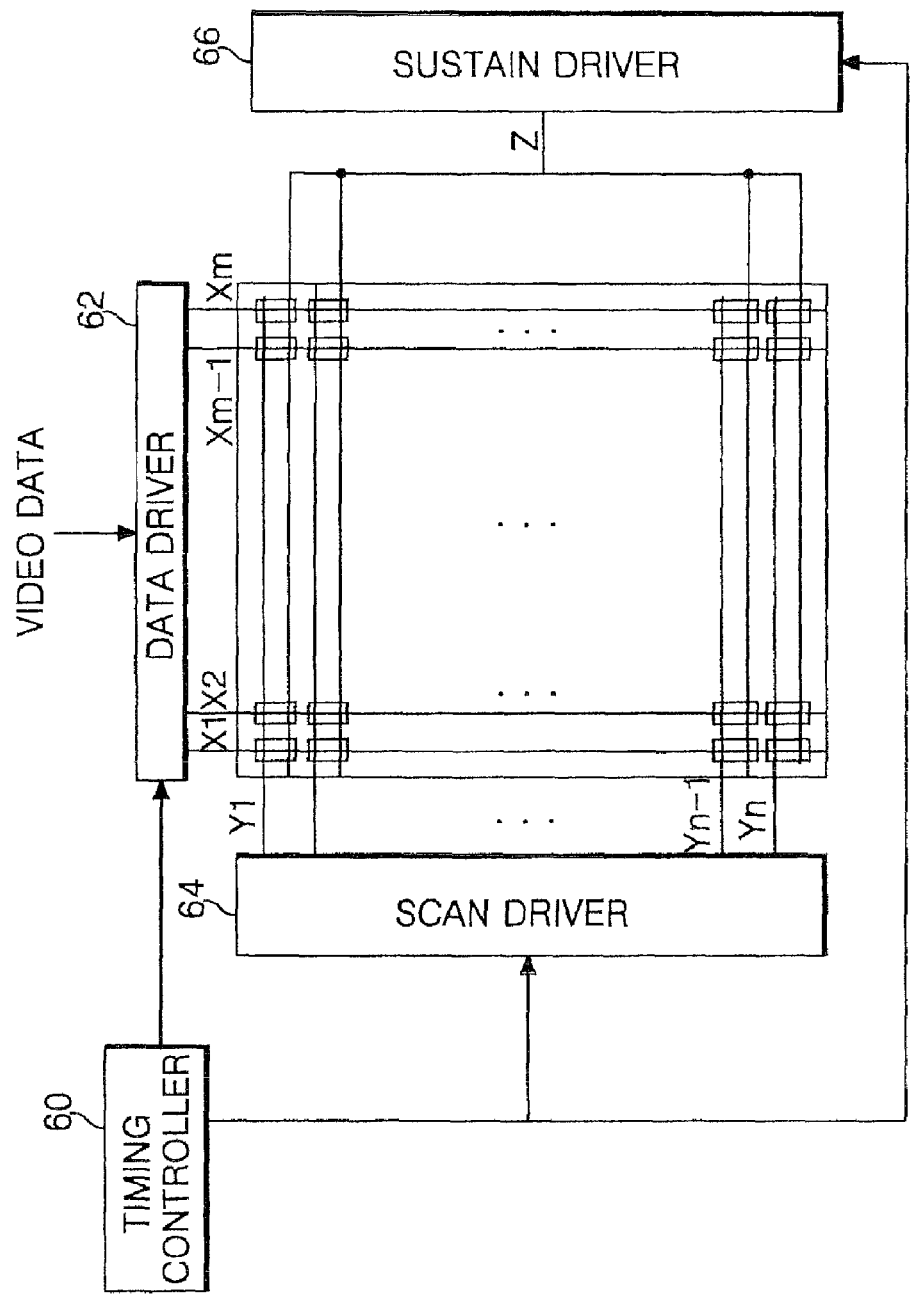
FIG. 6 is a block diagram representing a driving apparatus of a PDP according to an embodiment of the present invention.

FIG. 6 is a block diagram representing a driving apparatus of a PDP according to an embodiment of the present invention.

Referring to FIG. 6, the driving apparatus of the PDP according to the embodiment of the present invention includes a data driver 62 to apply data to data lines X1 to Xm; a scan driver 64 to apply an initialization voltage, a scan voltage and a sustain voltage to scan electrodes Y1 to Yn; a sustain driver 66 to apply a high temperature compensation voltage and a sustain voltage to a sustain electrode Z; and a timing controller 60 to control each of the drivers 62, 64 and 66.

The data driver 62 latches data by one line portion under the control of the timing controller 60 and applies the latched data to the data lines X1 to Xm simultaneously, wherein the data are mapped to each of sub fields by a sub field mapping unit (not shown) after being reverse-gamma corrected and error-diffused by a reverse gamma correction circuit and an error diffusion circuit (not shown) etc.

The scan driver 64 applies a rising ramp waveform and a falling ramp waveform to the scan electrodes Y1 to Yn in an initialization period, and then sequentially applies to the scan electrodes Y1 to Yn a scan pulse for selecting the scan lines in the address period. Herein, as the scanning order of the scan pulse comes later under a high temperature environment of 50° C. or more, the scan pulse has its voltage level go higher linearly or non-linearly, or heighten step by step in multi-steps. This is for making an address discharge generated stably even when the wall charges are excessively lost at the line where the scanning order is late under the high temperature environment by having a scan voltage at the line where the scanning order is late set higher than a scan voltage at the line where the scanning order is early. And the scanning driver 64 applies to the sustain electrodes Y1 to Yn the sustain pulse simultaneously for generating the sustain discharge with respect to the cells selected during the address period.

The sustain driver 66 applies a DC voltage in the set-down period, and then applies a high-temperature compensation voltage during the address period under a high temperature environment of 50° C. or more, wherein the high-temperature compensation voltage has its voltage level increase as the line is later in the scanning order. Herein, the voltage level of the high-temperature compensation voltage can be increased linearly or non-linearly, or can be increased step by step.

The timing controller 60 receives vertical/horizontal synchronization signals, generates timing control signals necessary for each of the drivers 62, 64 and 66, and applies the timing control signals to each of the drivers 62, 64 and 66.

The driving waveform generated from each of the drivers 62, 64 and 66 may be implemented in various forms as in FIG. 7 to 20.

Figure 7:
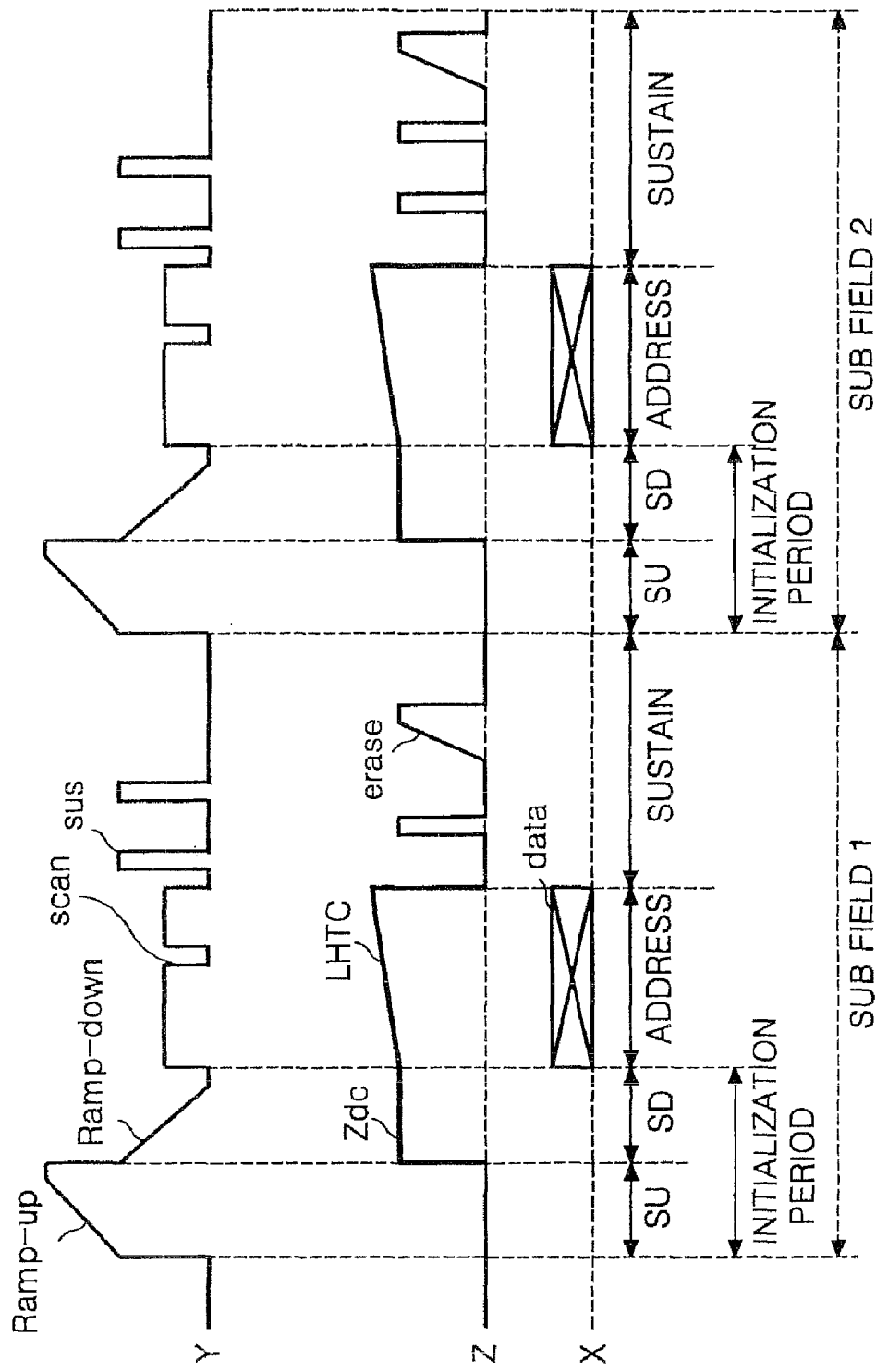
FIG. 7 is a waveform diagram representing a driving method of a PDP according to the first embodiment of the present invention.

FIG. 7 illustrates a driving waveform of a PDP according to the first embodiment of the present invention.

Referring to FIG. 7, the PDP according to the first embodiment of the present invention is driven by being divided into an initialization period to initialize a full screen, an address period to select cells and a sustain period to sustain discharges of the selected cells.

In the initialization period, a rising ramp waveform Ramp-up that rises up to a peak voltage higher than a sustain voltage is simultaneously applied to all scan electrodes Y for a setup period SU. The rising ramp waveform Ramp-up causes a discharge to occur within the cells of the full screen. As a result, positive wall charges are accumulated in the address electrode X and the sustain electrode Z, and negative wall charges is accumulated in the scan electrode Y. A falling ramp waveform Ramp-down that falls down to a ground voltage GND is simultaneously applied to the scan electrodes Y for the set-down period to eliminate the wall charges formed excessively within the cells. The wall charges are uniformly sustained within the cells so that an address discharge can be stably caused by the set-down discharge.

During the set-down period SD, the sustain electrode Z is supplied with a positive DC voltage Zdc so that an erasure discharge can be generated between the sustain electrode Z and the scan electrode Y.

In the address period, negative scan pulses SCAN are sequentially applied to the scan electrodes Y and at the same time positive data pulses DATA synchronized with the scan pulses SCAN are applied to the address electrodes X. The scan pulses SCAN and the data pulses DATA each have the same voltage level in all the lines. When the voltage difference between the scan pulse SCAN and the data pulse DATA is added to the wall voltages generated in the initialization period, the address discharge is generated within the cell to which the data pulse DATA is applied.

During such an address period, the sustain electrode Z is supplied with the high-temperature compensation voltage LHTC, the voltage level of which is increased linearly in proportion to the scanning order. The high-temperature compensation voltage LHTC increases the voltage of the sustain electrode Z at the line where wall charges and space charges are excessively lost, i.e., the line where its scanning order is late, to increase the amount of positive wall charges which are accumulated in the scan electrode Y and of negative wall charges accumulated in the sustain electrode Z. If the sustain voltage is applied even to the line with late scanning order by the high-temperature compensation voltage LHTC, the wall charges that can cause a discharge are formed within the cell.

In the sustain period, sustain pulses SUS are alternately applied to the scan electrodes Y and the sustain electrodes Z. In the cells selected by the address discharge, there occurs a sustain discharge, i.e., display discharge, between the scan electrode Y and the sustain electrode Z whenever each sustain pulse SUS is applied as the wall voltage within the cell is added to the sustain pulse SUS. More specifically, in the prior art, because of low wall voltages due to the wall charges excessively lost at the line where its scanning order is late, the discharge is not generated even though the sustain voltage is applied to the cell, however, the driving method and apparatus of the PDP according to the embodiment of the present invention increases the wall voltages sufficiently enough at the line having late scanning order in use of the high-temperature compensation voltage, thus the sustain discharge can be generated stably even at the line having late scanning order. After the completion of the sustain discharge, a small ramp waveform ERASE applied to the sustain electrode Z removes the wall charges generated upon the sustain discharge.

Figure 8:
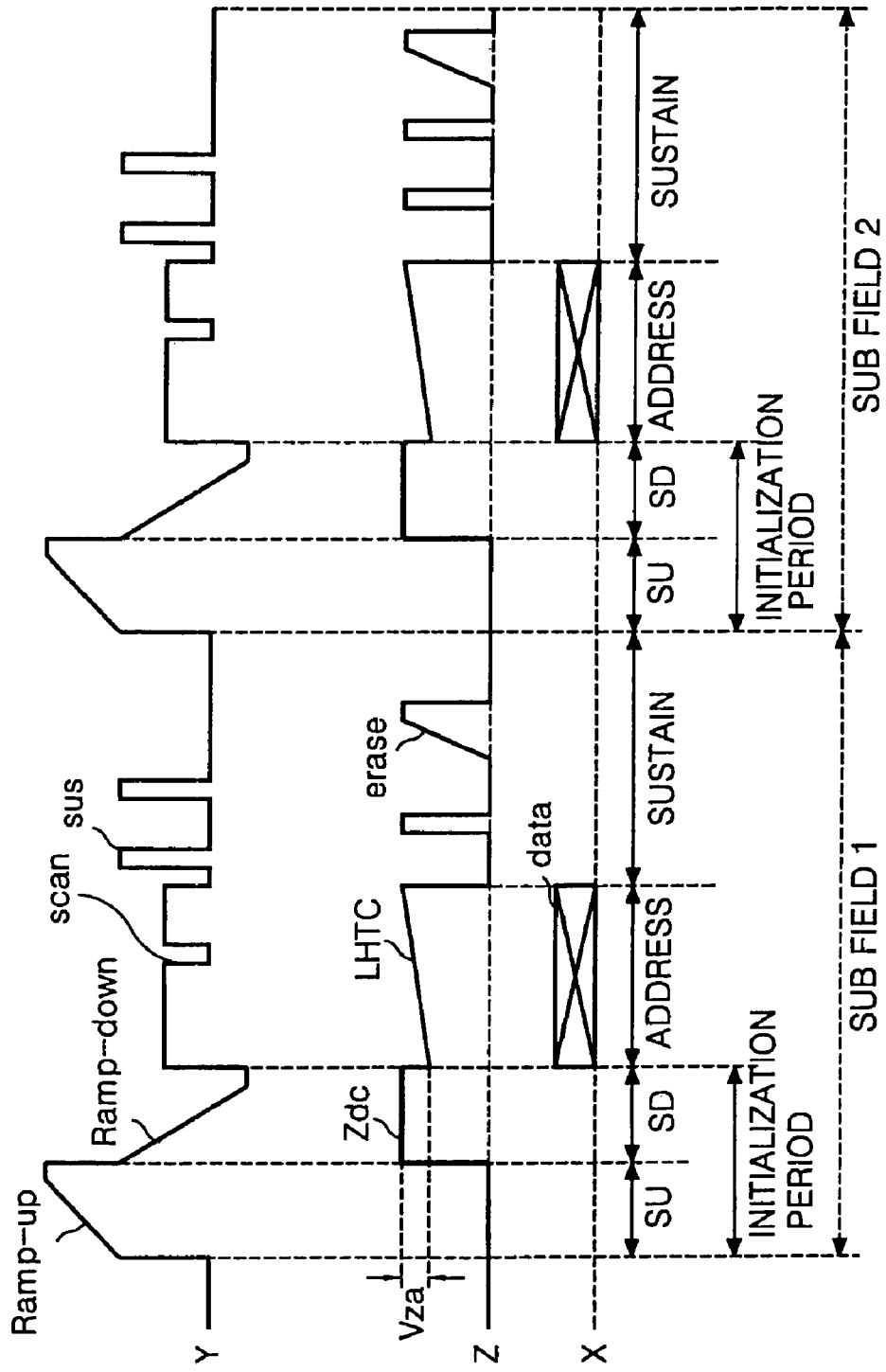
FIG. 8 is a waveform diagram representing a driving method of a PDP according to the second embodiment of the present invention.

FIG. 8 illustrates a driving waveform of a PDP according to the second embodiment of the present invention.

Referring to FIG. 8, in the setup period SU of the initialization period, a rising ramp waveform Ramp-up that rises up to a peak voltage higher than a sustain voltage is simultaneously applied to all scan electrodes Y. The rising ramp waveform Ramp-up causes a discharge to occur within the cells of the full screen. Subsequently, a falling ramp waveform Ramp-down that falls down to a negative voltage level lower than a ground voltage GND is simultaneously applied to the scan electrodes Y for the set-down period to eliminate the wall charges formed excessively within the cells. The wall charges are uniformly sustained within the cells so that an address discharge can be stably caused by the set-down discharge.

During the set-down period SD, the sustain electrode Z is supplied with a positive DC voltage Zdc so that an erasure discharge can be generated between the sustain electrode Z and the scan electrode Y.

In the address period, negative scan pulses SCAN are sequentially applied to the scan electrodes Y and at the same time positive data pulses DATA synchronized with the scan pulses SCAN are applied to the address electrodes X. The scan pulses SCAN and the data pulses DATA each have the same voltage level in all the lines. When the voltage difference between the scan pulse SCAN and the data pulse DATA is added to the wall voltages generated in the initialization period, the address discharge is generated within the cell to which the data pulse DATA is applied.

During the address period, the sustain electrode Z is supplied with the high-temperature compensation voltage LHTC, which rises from a voltage level lower than the positive DC voltage Zdc applied during the set-down period in view of the voltage level of the scan electrode Y that dropped to a designated negative potential in the set-down period. In other words, the start voltage of the high temperature compensation voltage LHTC is lower than the DC voltage Zdc of the set-down period SD by Vza. The reason why the high-temperature compensation voltage LHTC rises from the voltage level lower than the positive DC voltage Zdc is that the negative wall voltages in the scan electrode Y gets lower than the falling ramp waveform Ramp-down which falls down to the ground voltage because the falling ramp waveform Ramp-down drops down to the designated negative voltage level in the set-down period SD. That is, for the high-temperature compensation voltage LHTC to rise from the voltage level lower than the positive DC voltage Zdc is to prevent a misdischarge between the scan electrode Y and the sustain electrode Z by lowering the voltage in the sustain electrode Z as much as the wall voltage in the scan electrode Y is decreased.

The high-temperature compensation voltage LHTC having its voltage level rise linearly in proportion to the scanning order increases the voltage of the sustain electrode Z at the line where its scanning order is late, to increase the amount of positive wall charges which are accumulated in the scan electrode Y and of negative wall charges accumulated in the sustain electrode Z. If the sustain voltage is applied even to the line with late scanning order by the high-temperature compensation voltage LHTC, the wall charges that can cause a discharge are formed within the cell.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS.

In the address period, because of the high temperature compensation voltage LHTC applied to the sustain electrode Z, the wall charges are increased sufficiently at the line having late scanning order, thus the sustain discharge can be generated stably even at the line having late scanning order. After the completion of the sustain discharge, a small ramp waveform ERASE applied to the sustain electrode Z removes the wall charges generated upon the sustain discharge.

In FIGS. 7 and 8, the gradient of the high temperature compensation voltage LHTC that is applied to the sustain electrode Z can be adjusted in accordance with an RC time constant determined by a resistance value or a capacitance value in the sustain driver 66.

Figure 9:
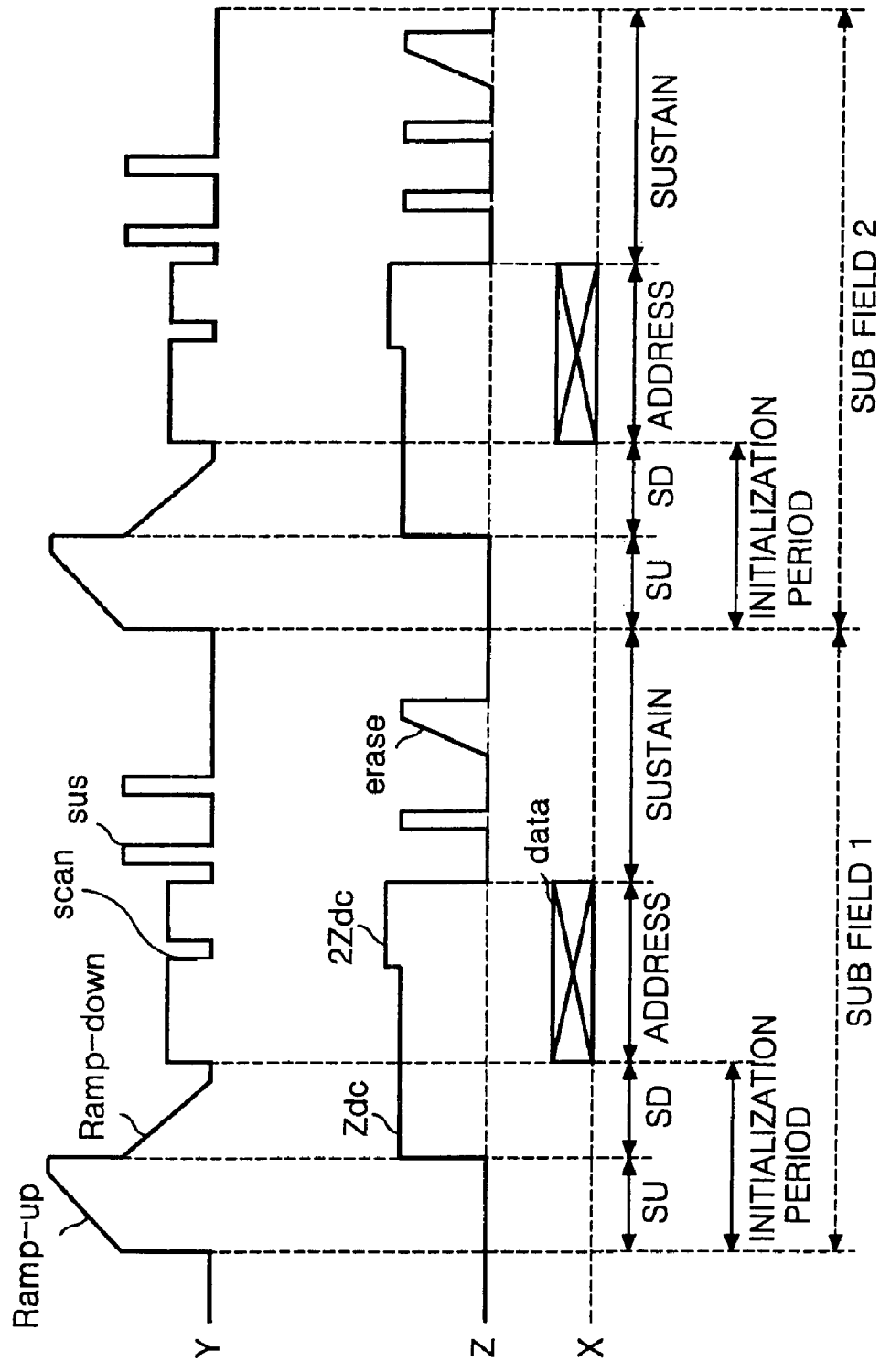
FIG. 9 is a waveform diagram representing a driving method of a PDP according to the third embodiment of the present invention.

FIG. 9 illustrates a driving waveform of a PDP according to the third embodiment of the present invention.

Referring to FIG. 9, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period to eliminate the wall charges formed excessively within the cells.

In the address period, negative scan pulses SCAN are sequentially applied to the scan electrodes Y and at the same time positive data pulses DATA synchronized with the scan pulses SCAN are applied to the address electrodes X. When the voltage difference between the scan pulse SCAN and the data pulse DATA is added to the wall voltages generated in the initialization period, the address discharge is generated within the cell to which the data pulse DATA is applied.

After being supplied with the positive DC voltage Zdc during the set-down period SD and the first half of the address period, the sustain voltage Z is supplied with a second positive DC voltage 2Zdc higher than the positive DC voltage Zdc during the second half of the address period. The second positive DC voltage 2Zdc increases the voltage of the sustain electrode Z at the line where its scanning order is relatively late, so as to increase the amount of the positive wall charges accumulated in the scan electrode Y and the negative wall charges accumulated in the sustain electrode Z. The wall voltages that can cause a discharge are formed within the cell if the sustain voltage is applied even at the line scanned in the second half by the second positive DC voltage 2Zdc.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. Because of the second positive DC voltage 2Zdc, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 10:
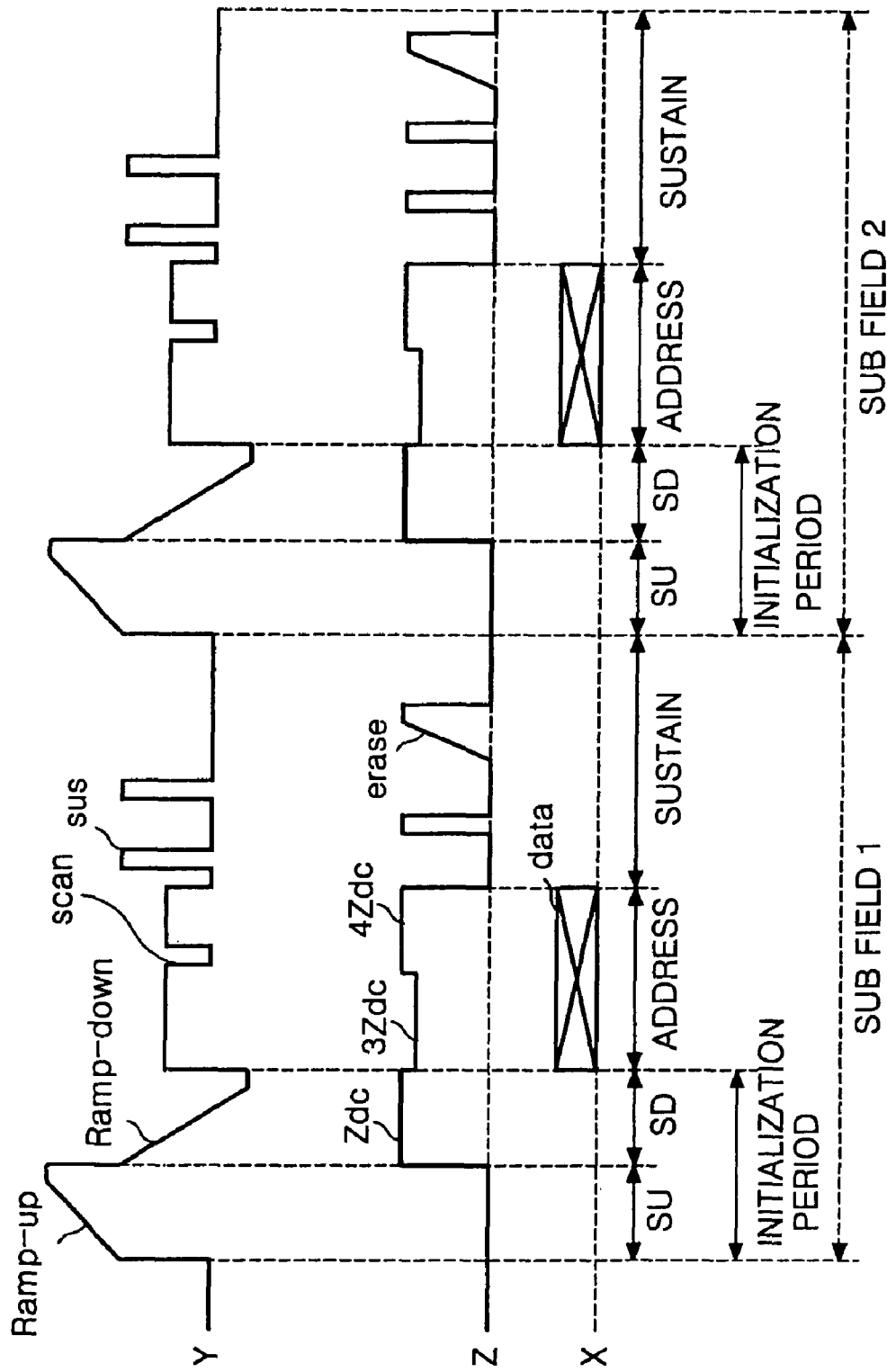
FIG. 10 is a waveform diagram representing a driving method of a PDP according to the fourth embodiment of the present invention.

FIG. 10 illustrates a driving waveform of a PDP according to the fourth embodiment of the present invention.

Referring to FIG. 10, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a negative voltage level lower than a ground voltage GND is simultaneously applied to the scan electrodes Y for the set-down period.

In the address period, negative scan pulses SCAN are sequentially applied to the scan electrodes Y and at the same time positive data pulses DATA synchronized with the scan pulses SCAN are applied to the address electrodes X. When the voltage difference between the scan pulse SCAN and the data pulse DATA is added to the wall voltages generated in the initialization period, the address discharge is generated within the cell to which the data pulse DATA is applied.

The sustain electrode Z is supplied with the positive DC voltage Zdc during the set-down period SD. And after the sustain voltage Z is supplied with a third positive DC voltage 3Zdc lower than the positive DC voltage Zdc during the first half of the address period, a fourth positive DC voltage 4Zdc equal to or higher than the positive DC voltage Zdc is applied during the second half of the address period. The reason why the third and fourth positive DC voltage 3Zdc, 4Zdc are lower than that of the third embodiment of the present invention is that a mis-discharge between the scan electrode Y and the sustain electrode Z is to be prevented by lowering the voltage in the sustain electrode Z as much as the wall voltage in the scan electrode Y is reduced more because or the falling ramp waveform Ramp-down that falls down to the negative voltage level. The fourth positive DC voltage 4Zdc increases the voltage in the sustain electrode Z at the lines where their scanning order are relatively late, thereby increasing the amount of positive wall charges accumulated in the scan electrode Y and of negative wall charges accumulated in the sustain electrode Z. This fourth positive DC voltage 4Zdc causes the wall charges to be formed within the cell even at the lines that are scanned in the second half of the address period, wherein the wall charges are capable of generating the discharge when the sustain voltage is applied.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. Because of the fourth positive DC voltage 4Zdc, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

In FIGS. 9 and 10, the DC voltage of two-step form applied to the sustain electrode Z can be implemented only by adding a switch device that switches an individual voltage source and its voltage to the sustain driver 66. The DC voltage applied to the sustain electrode Z, in FIGS. 9 and 10, is divided into two steps, but it can also be divided into multi-steps.

Figure 11:
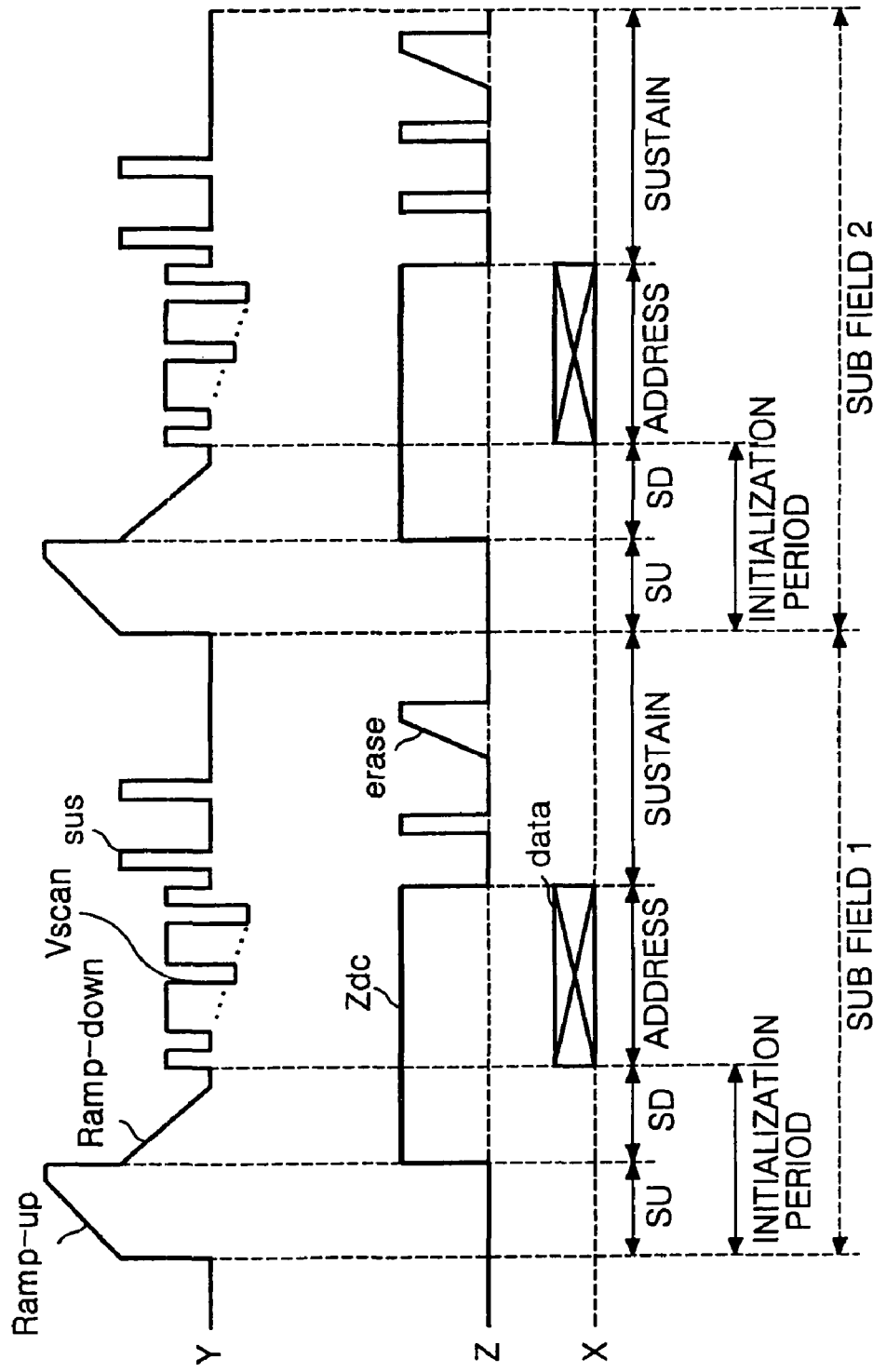
FIG. 11 is a waveform diagram representing a driving method of a PDP according to the fifth embodiment of the present invention.

FIG. 11 illustrates a driving waveform of a PDP according to the fifth embodiment of the present invention.

Referring to FIG. 11, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the address period, scan pulses VSCAN are sequentially applied to the scan electrodes Y, wherein the scan pulses VSCAN has a higher voltage level in a negative direction as their scanning order gets later. Positive data pulses DATA synchronized with the scan pulses VSCAN are applied to the address electrodes X. When the voltage difference between the scan pulse VSCAN and the data pulse DATA is added to the wall voltages generated in the initialization period, the address discharge is generated within the cell to which the data pulse DATA is applied. The scan pulses VSCAN has its voltage level increase linearly in a negative direction in proportion to the scanning order to increase the voltage in the scan electrode Y at the line where its scanning order is late, thereby increasing the amount of positive wall charges accumulated in the scan electrode Y and of negative wall charges accumulated in the sustain electrode Z. This scan pulse VSCAN causes the wall voltages to be formed within the cell even at the line where its scanning order is late, wherein the wall voltages are capable of generating the discharge when the sustain voltage is applied.

The sustain electrode Z is supplied with the positive DC voltage Zdc during the set-down period and the address period. The DC voltage Zdc sets the voltage difference between the sustain electrode Z and the scan electrode Y or the sustain electrode Z and the address electrode X so as to cause a set-down discharge to occur between the sustain electrode Z and the scan electrode Y for the set-down period, and at the same time so as not to cause a discharge to be generated on a large scale between the scan electrode Y and the sustain electrode Z for the address period.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the scan pulse VSCAN applied to the scan electrode Y, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 12:
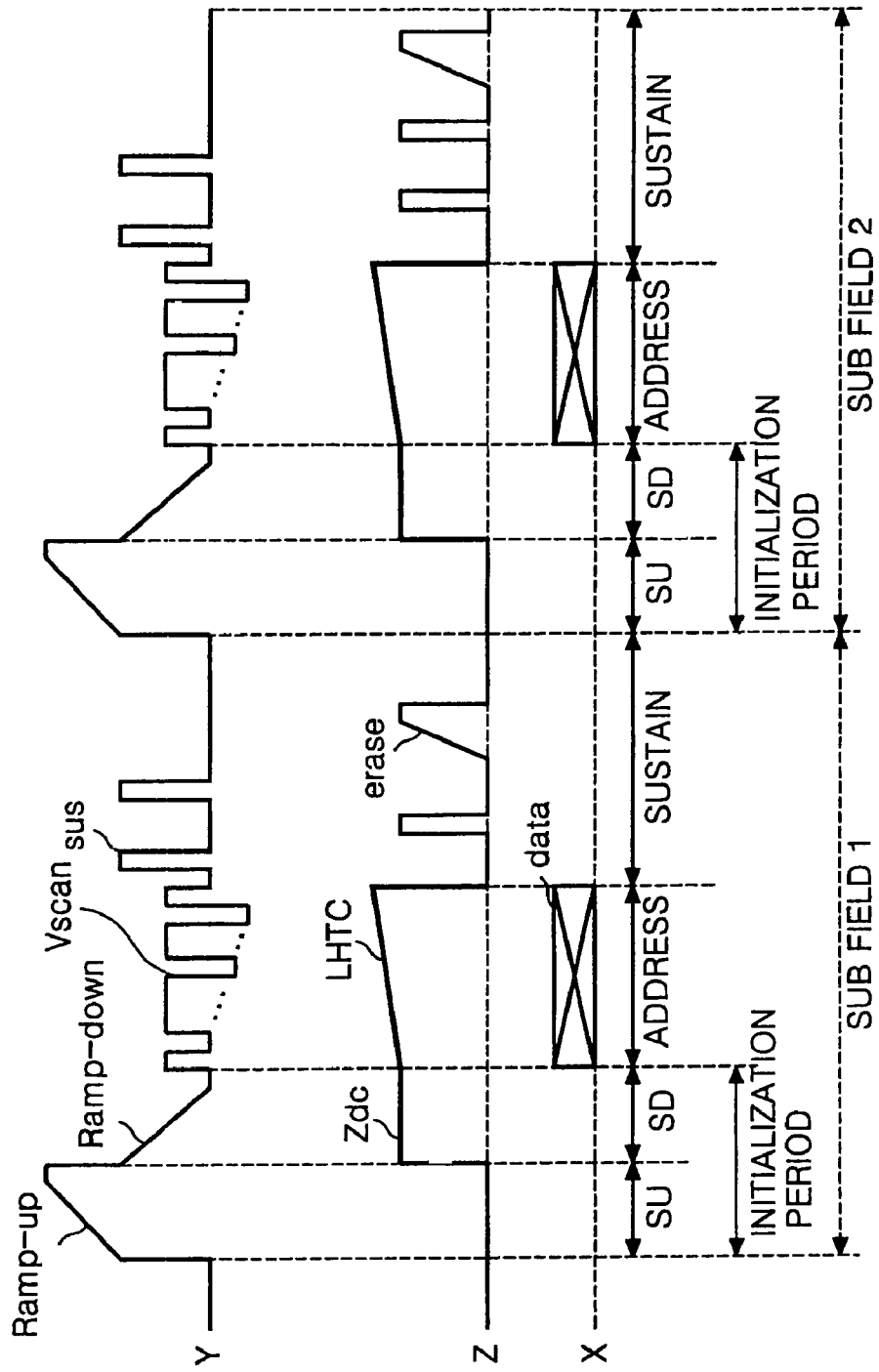
FIG. 12 is a waveform diagram representing a driving method of a PDP according to the sixth embodiment of the present invention.

FIG. 12 illustrates a driving waveform of a PDP according to the sixth embodiment of the present invention.

Referring to FIG. 12, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the address period, scan pulses VSCAN are sequentially applied to the scan electrodes Y, wherein the scan pulses VSCAN has a higher voltage level in a negative direction as their scanning order gets later. Positive data pulses DATA synchronized with the scan pulses VSCAN are applied to the address electrodes X. When the voltage difference between the scan pulse VSCAN and the data pulse DATA is added to the wall voltages generated in the initialization period, the address discharge is generated within the cell to which the data pulse DATA is applied. During the address period, the sustain electrode Z is supplied with a high-temperature compensation voltage LHTC that has its voltage level increase linearly in proportion to the scanning order. The scan pulse VSCAN and the high-temperature compensation voltage LHTC increase the voltage of the sustain electrode Z at the line where its scanning order is late, thereby increasing the amount of the positive wall charges accumulated in the scan electrode Y and of the negative wall charges accumulated in the sustain electrode Z. The scan pulse VSCAN and the high-temperature compensation voltage LHTC cause the wall voltages to be formed within the cell even at the line where its scanning order is late, wherein the wall voltages are capable of generating the discharge when the sustain voltage is applied. In each of the scan pulse VSCAN and the high-temperature compensation voltage LHTC, because both the scan pulse VSCAN and the high-temperature compensation voltage LHTC have their voltage level increase in proportion to the scanning order, the difference between the minimum voltage and the maximum voltage is smaller than that in the scan pulse VSCAN and the high-temperature compensation voltage LHTC shown in FIGS. 7 and 11.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the scan pulse VSCAN and the high-temperature compensation voltage LHTC applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 13:
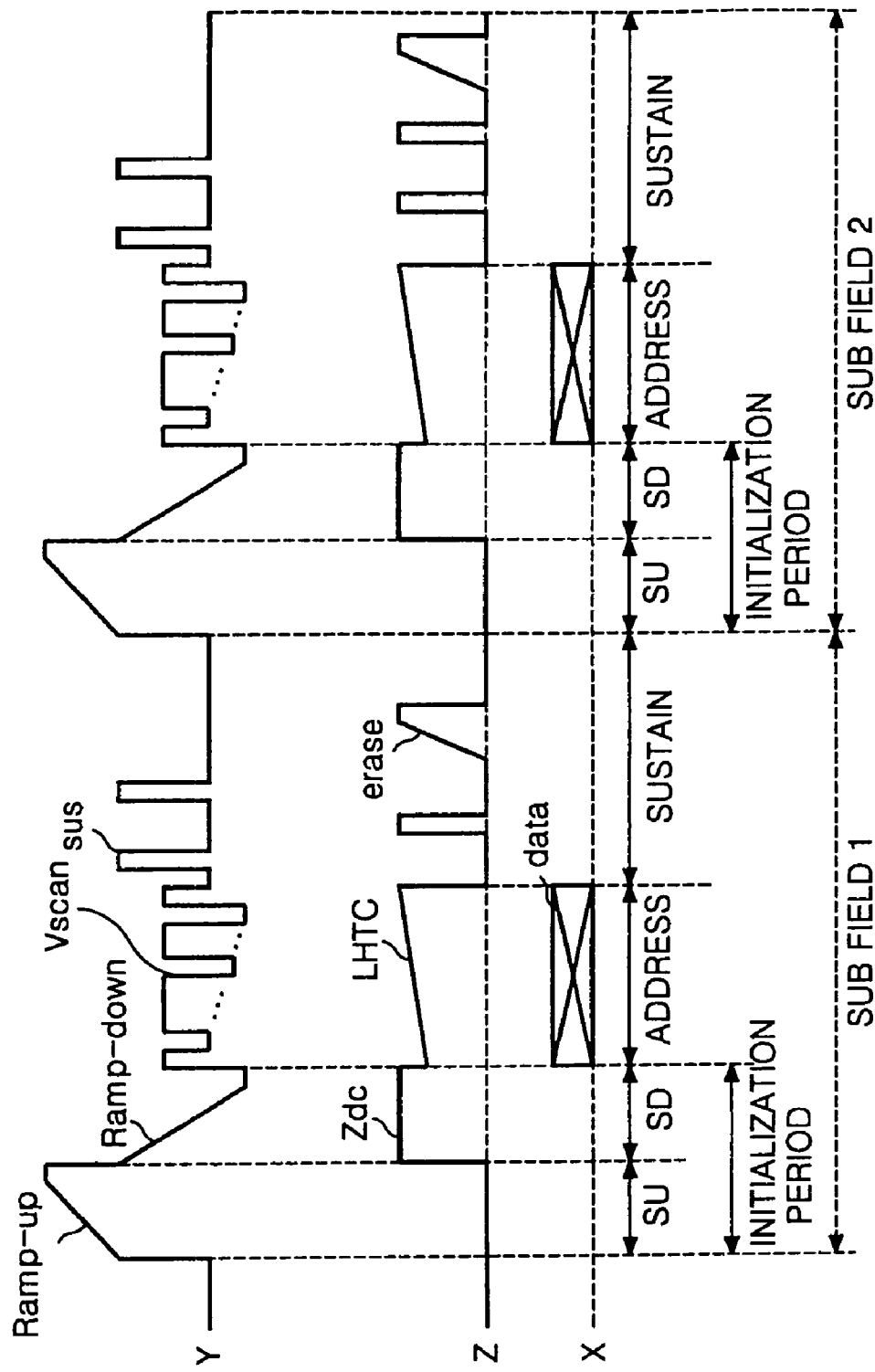
FIG. 13 is a waveform diagram representing a driving method of a PDP according to the seventh embodiment of the present invention.

FIG. 13 illustrates a driving waveform of a PDP according to the seventh embodiment of the present invention.

Referring to FIG. 13, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a negative voltage level lower than a ground voltage GND is simultaneously applied to the scan electrodes Y for the set-down period.

During the set-down period SD, the sustain electrode Z is supplied with a positive DC voltage Zdc so that an erasure discharge can be generated between the sustain electrode Z and the scan electrode Y.

In the address period, scan pulses VSCAN are sequentially applied to the scan electrodes Y, wherein the scan pulses VSCAN has a higher voltage level in a negative direction as their scanning order gets later. Positive data pulses DATA synchronized with the scan pulses VSCAN are applied to the address electrodes X. When the voltage difference between the scan pulse VSCAN and the data pulse DATA is added to the wall voltages generated in the initialization period, the address discharge is generated within the cell to which the data pulse DATA is applied. During the address period, the sustain electrode Z is supplied with a high-temperature compensation voltage LHTC that rises from a voltage level lower than the positive DC voltage Zdc applied for the set-down period SD in consideration of the voltage level of the scan electrode Y, which has been dropped to a designated negative potential for the set-down period. The scan pulse VSCAN and the high-temperature compensation voltage LHTC increase the voltage of the sustain electrode Z at the line where its scanning order is late, thereby increasing the amount of the positive wall charges accumulated in the scan electrode Y and of the negative wall charges accumulated in the sustain electrode Z. The scan pulse VSCAN and the high-temperature compensation voltage LHTC cause the wall voltages to be formed within the cell even at the line where its scanning order is late, wherein the wall voltages are capable of generating the discharge when the sustain voltage is applied. In each of the scan pulse VSCAN and the high-temperature compensation voltage LHTC, because both the scan pulse VSCAN and the high-temperature compensation voltage LHTC have their voltage level increase in proportion to the scanning order, the difference between the minimum voltage and the maximum voltage is smaller than that in the scan pulse VSCAN and the high-temperature compensation voltage LHTC shown in FIGS. 8 and 11.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the scan pulse VSCAN and the high-temperature compensation voltage LHTC applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 14:
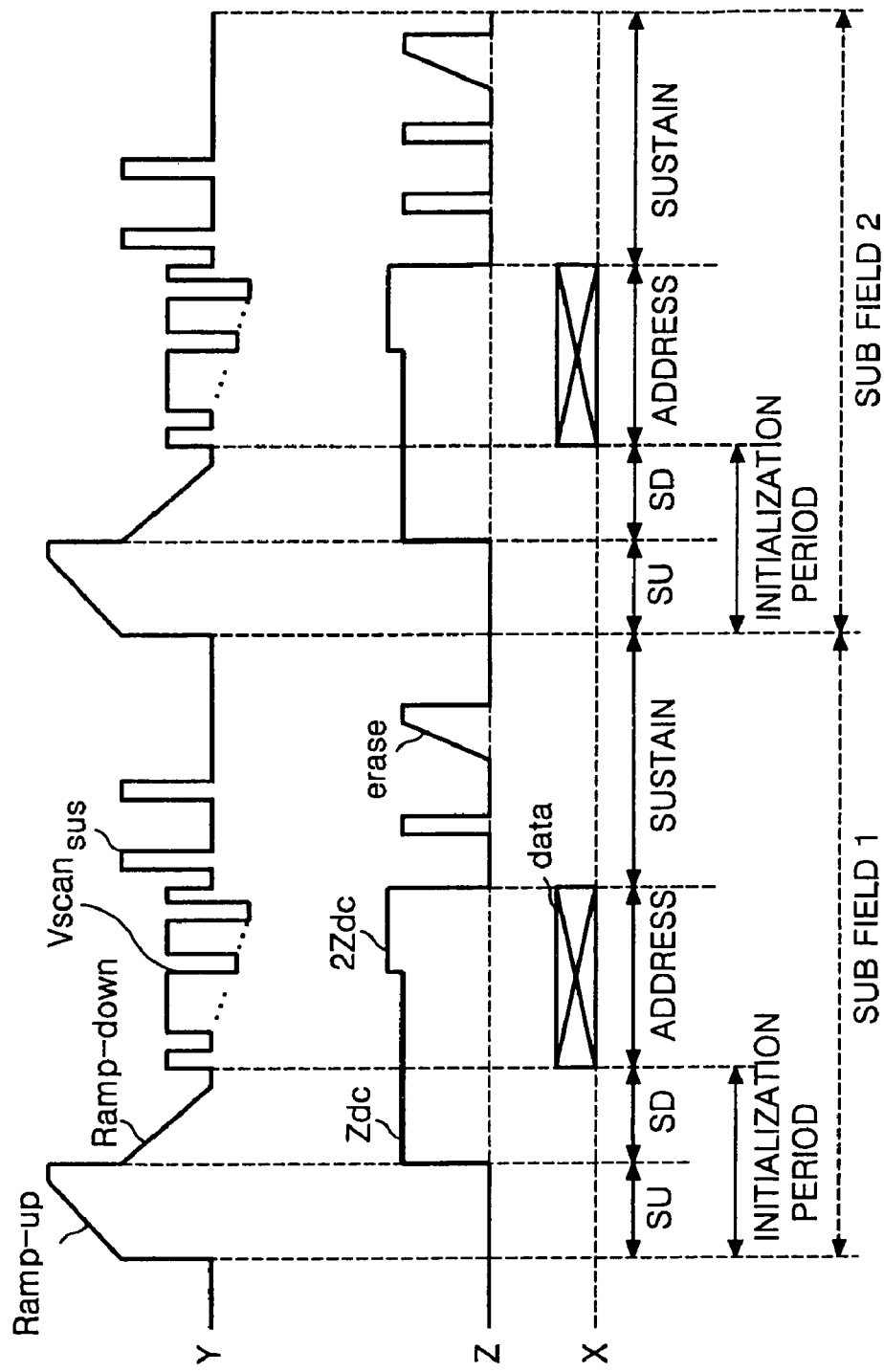
FIG. 14 is a waveform diagram representing a driving method of a PDP according to the eighth embodiment of the present invention.

FIG. 14 illustrates a driving waveform of a PDP according to the eighth embodiment of the present invention.

Referring to FIG. 14, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the address period, scan pulses VSCAN are sequentially applied to the scan electrodes Y, wherein the scan pulses VSCAN has a higher voltage level in a negative direction as their scanning order gets later. Positive data pulses DATA synchronized with the scan pulses VSCAN are applied to the address electrodes X. When the voltage difference between the scan pulse VSCAN and the data pulse DATA is added to the wall voltages generated in the initialization period, the address discharge is generated within the cell to which the data pulse DATA is applied. After a positive DC voltage being applied during the set-down period SD and the first half of the address period, a second positive DC voltage 2Zdc higher than the positive DC voltage Zdc is applied during the second half of the address period. The scan pulse VSCAN and the second positive DC voltage 2Zdc increase the voltage of the sustain electrode Z at the line where its scanning order is relatively late, thereby increasing the amount of the positive wall charges accumulated in the scan electrode Y and of the negative wall charges accumulated in the sustain electrode Z. The scan pulse VSCAN and the second positive DC voltage 2Zdc cause the wall voltages to be formed within the cell even at the line that is scanned in the second half of the address period, wherein the wall voltages are capable of generating the discharge when the sustain voltage is applied. The difference between the minimum voltage and the maximum voltage in the scan pulse VSCAN and the difference between the positive DC voltage Zdc and the second positive DC voltage 2Zdc are smaller than that in the scan pulse VSCAN and the high-temperature compensation voltage LHTC shown in FIGS. 9 and 11 because both the scan pulse VSCAN and the second positive DC voltage 2Zdc have their voltage level increase in proportion to the scanning order.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the scan pulse VSCAN and the second positive DC voltage 2Zdc applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 15:
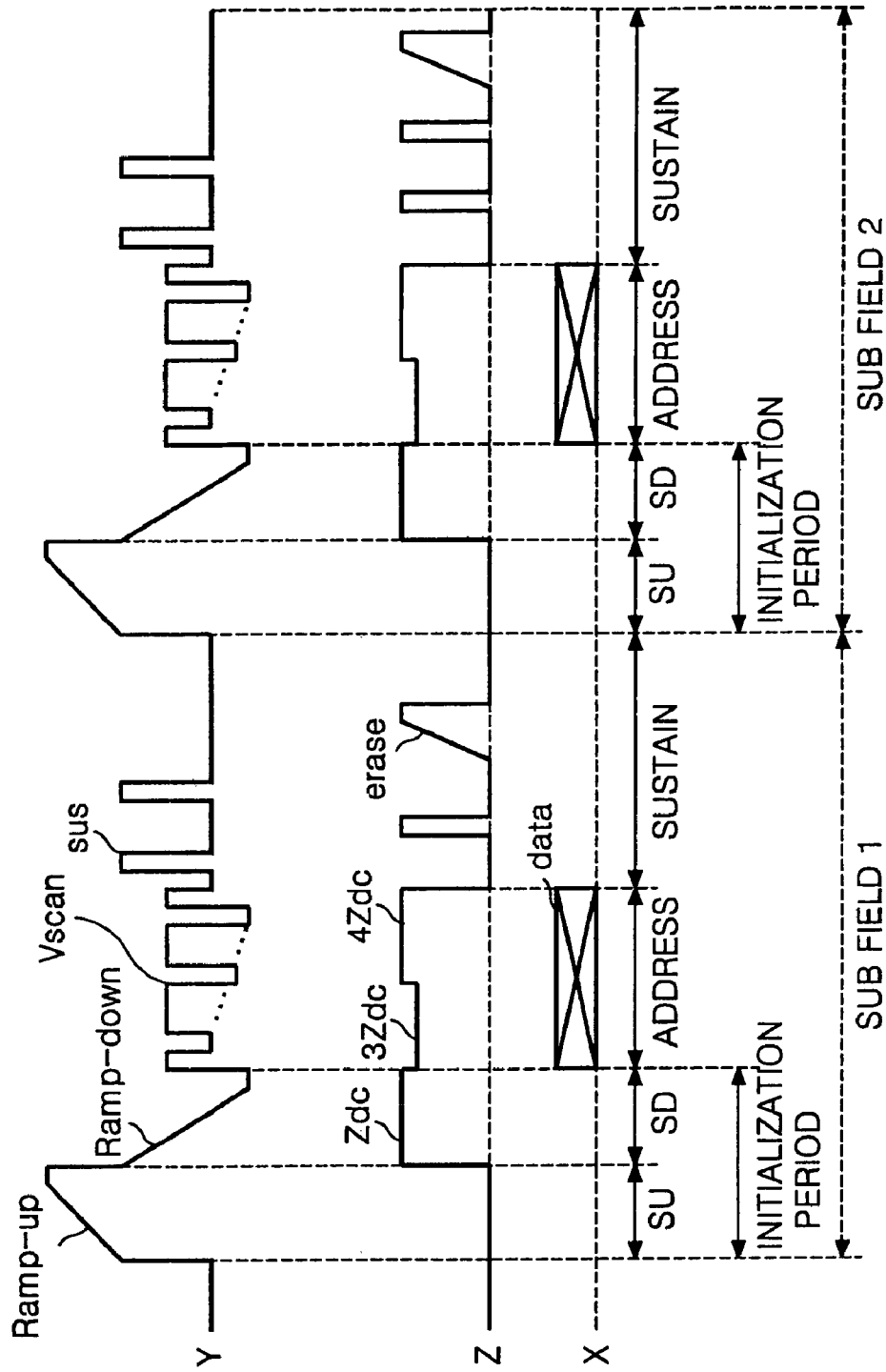
FIG. 15 is a waveform diagram representing a driving method of a PDP according to the ninth embodiment of the present invention.

FIG. 15 illustrates a driving waveform of a PDP according to the ninth embodiment of the present invention.

Referring to FIG. 15, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a negative voltage level lower than a ground voltage GND is simultaneously applied to the scan electrodes Y for the set-down period.

In the address period, scan pulses VSCAN are sequentially applied to the scan electrodes Y, wherein the scan pulses VSCAN has a higher voltage level in a negative direction as their scanning order gets later. Positive data pulses DATA synchronized with the scan pulses VSCAN are applied to the address electrodes X. When the voltage difference between the scan pulse VSCAN and the data pulse DATA is added to the wall voltages generated in the initialization period, the address discharge is generated within the cell to which the data pulse DATA is applied.

The sustain electrode Z is supplied with the positive DC voltage Zdc for the set-down period SD. And in the first half of the address period, the sustain electrode Z is supplied with a third positive DC voltage 3Zdc, which has a lower voltage level than the positive DC voltage Zdc, and then in the second half of the address period, supplied with a fourth positive DC voltage 4$dc$, which has a higher voltage level than the third positive DC voltage 3Zdc.

During the address period, the scan pulse VSCAN and the fourth positive DC voltage 4Zdc increase the voltage of the sustain electrode Z at the line where its scanning order is relatively late, thereby increasing the amount of the positive wall charges accumulated in the scan electrode Y and of the negative wall charges accumulated in the sustain electrode Z. The scan pulse VSCAN and the second positive DC voltage 2Zdc cause the wall voltages to be formed within the cell even at the line that is scanned in the second half of the address period, wherein the wall voltages are capable of generating the discharge when the sustain voltage is applied. The difference between the minimum voltage and the maximum voltage in the scan pulse VSCAN and the third and fourth positive DC voltages 3Zdc, 4Zdc are smaller than that in the scan pulse VSCAN and the third and fourth positive DC voltages 3Zdc, 4Zdc shown in FIGS. 10 and 11.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the scan pulse VSCAN and the fourth positive DC voltage 4Zdc applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 16:
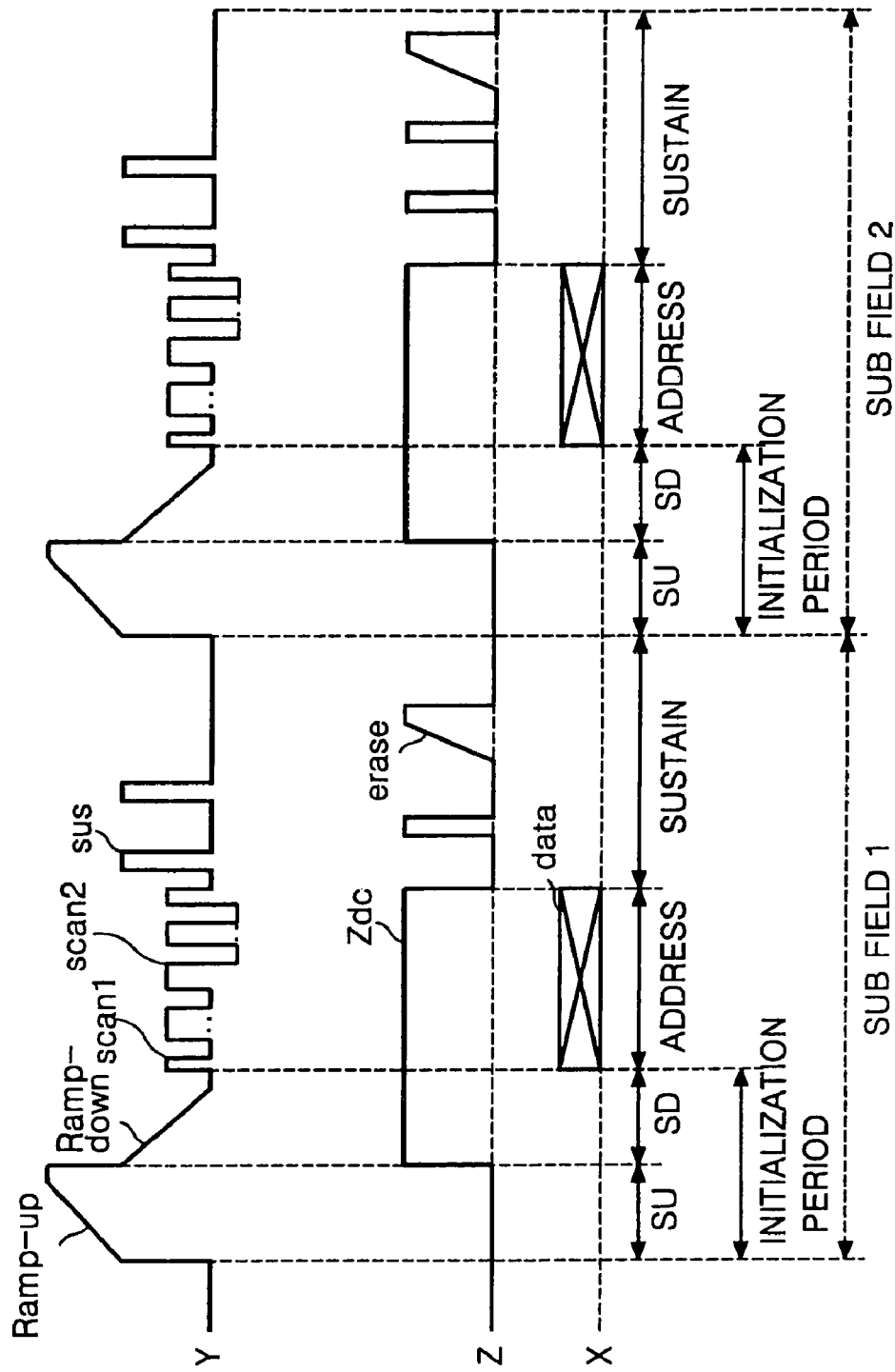
FIG. 16 is a waveform diagram representing a driving method of a PDP according to the tenth embodiment of the present invention.

FIG. 16 illustrates a driving waveform of a PDP according to the tenth embodiment of the present invention.

Referring to FIG. 16, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the first half of the address period, a first scan pulse SCAN1 of designated voltage level is sequentially applied to the scan electrodes Y, which come relatively earlier in scanning order. In the second half of the address period, a second scan pulse SCAN2 is sequentially applied to the scan electrodes Y, which come relatively later in scanning order, wherein the second scan pulse SCAN2 has a higher voltage level in a negative direction as compared with the first scan pulse SCAN1. For instance, assuming that the number of scan electrodes Y is 'n' as in FIG. 6, the first scan pulse SCAN1 is applied to the first scan electrode Y1 to the $(n/2)^{th}$ scan electrode Yn/2 and the second scan pulse SCAN2 is applied to the $Y(n/2+1)^{th}$ scan electrode Yn/2+1 to the $n^{th}$ scan electrode Yn. Positive data pulses DATA synchronized with the scan pulses SCAN1, SCAN2 are applied to the address electrodes X. When the voltage difference between the scan pulses SCAN1, SCAN2 and the data pulse DATA is added to the wall voltages generated in the initialization period, the address discharge is generated within the cell to which the data pulse DATA is applied. The second scan pulse SCAN2 increases the voltage of the sustain electrode Z at the line where its scanning order is late, thereby increasing the amount of the positive wall charges accumulated in the scan electrode Y and of the negative wall charges accumulated in the sustain electrode Z. The second scan pulse SCAN2 causes the wall voltages to be formed within the cell even at the line where its scanning order is late, wherein the wall voltages are capable of generating the discharge when the sustain voltage is applied.

The sustain electrode Z is supplied with the positive DC voltage Zdc during the set-down period and the address period. The DC voltage Zdc sets the voltage difference between the sustain electrode Z and the scan electrode Y or the sustain electrode Z and the address electrode X so as to cause a set-down discharge to occur between the sustain electrode Z and the scan electrode Y for the set-down period, and at the same time so as not to cause a discharge to be generated on a large scale between the scan electrode Y and the sustain electrode Z for the address period.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the second scan pulse SCAN2 applied to the scan electrode Y, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

In FIG. 16, the voltage level of the scan pulses SCAN1, SCAN2 applied to the scan electrodes Y is set to be two, but it is possible to further subdivide the voltage level into three or more and to apply a scan pulse of higher voltage level as the scan electrode Y gets late in scanning order.

Figure 17:
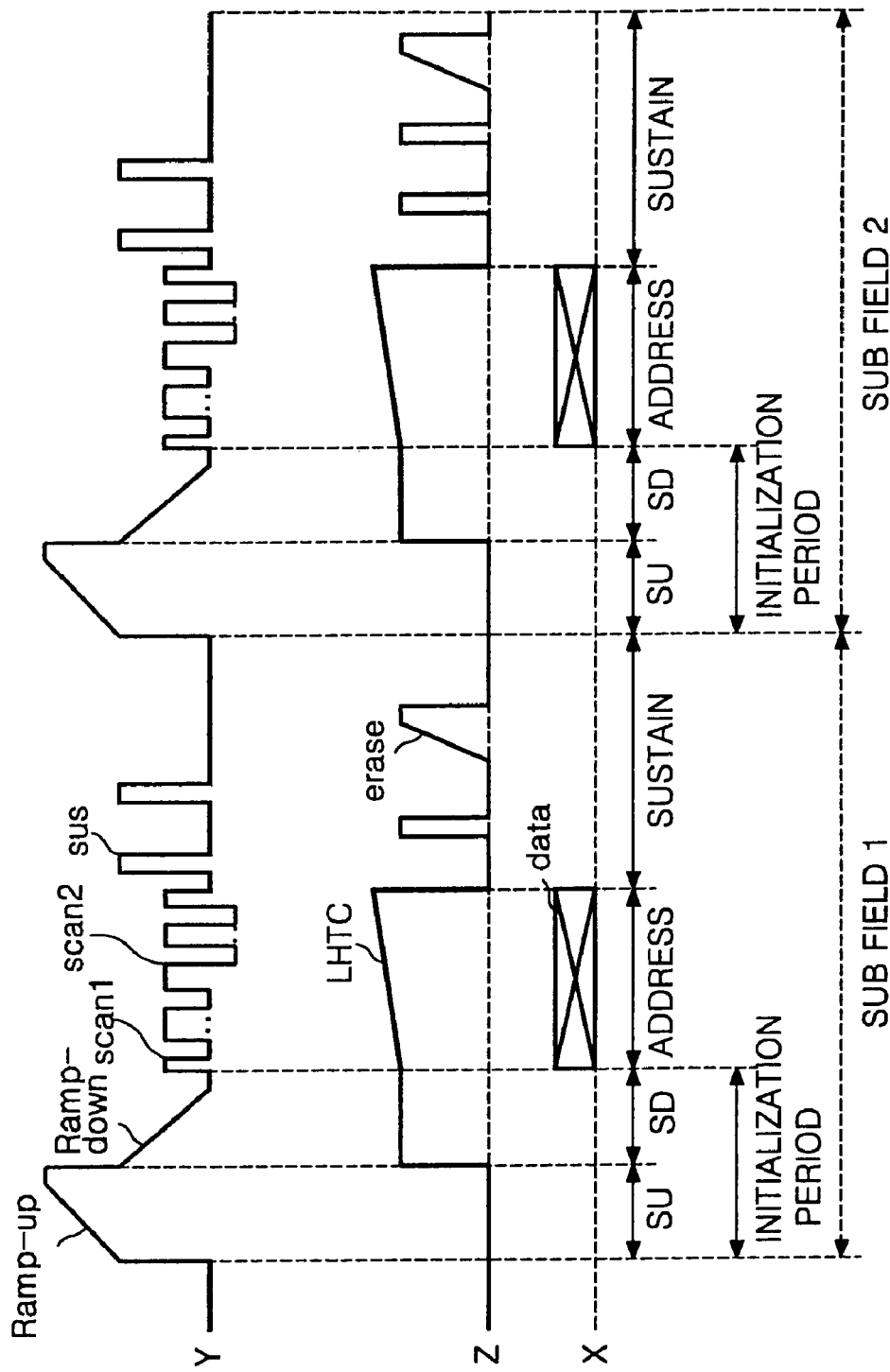
FIG. 17 is a waveform diagram representing a driving method of a PDP according to the eleventh embodiment of the present invention.

FIG. 17 illustrates a driving waveform of a PDP according to the eleventh embodiment of the present invention.

Referring to FIG. 17, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the first half of the address period, a first scan pulse SCAN1 of designated voltage level is sequentially applied to the scan electrodes Y, which come relatively earlier in scanning order. In the second half of the address period, a second scan pulse SCAN2 is sequentially applied to the scan electrodes Y, which come relatively later in scanning order, wherein the second scan pulse SCAN2 has a higher voltage level in a negative direction as compared with the first scan pulse SCAN1. Positive data pulses DATA synchronized with the scan pulses SCAN1, SCAN2 are applied to the address electrodes X. When the voltage difference between the scan pulses SCAN1, SCAN2 and the data pulse DATA is added to the wall voltages generated in the initialization period, the address discharge is generated within the cell to which the data pulse DATA is applied. During the address period, the sustain electrode Z is supplied with a high-temperature compensation voltage LHTC, which has its voltage level increase linearly in proportion to the scanning order.

The second scan pulse SCAN2 and the high-temperature compensation voltage LHTC increase the voltage of the scan electrode Y and the sustain electrode Z at the line where its scanning order is late, thereby increasing the amount of the positive wall charges accumulated in the scan electrode Y and of the negative wall charges accumulated in the sustain electrode Z. The second scan pulse SCAN2 and the high-temperature compensation voltage LHTC cause the wall voltages to be formed within the cell even at the line where its scanning order is late, wherein the wall voltages are capable of generating the discharge when the sustain voltage is applied. The difference between the minimum voltage and the maximum voltage in the high-temperature compensation voltage LHTC and the voltage of the second scan pulse SCAN2 become smaller as compared with the high-temperature compensation voltage LHTC and the second scan pulse SCAN2 shown in FIGS. 7 and 16.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the second scan pulse SCAN2 and the high-temperature compensation voltage LHTC applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 18:
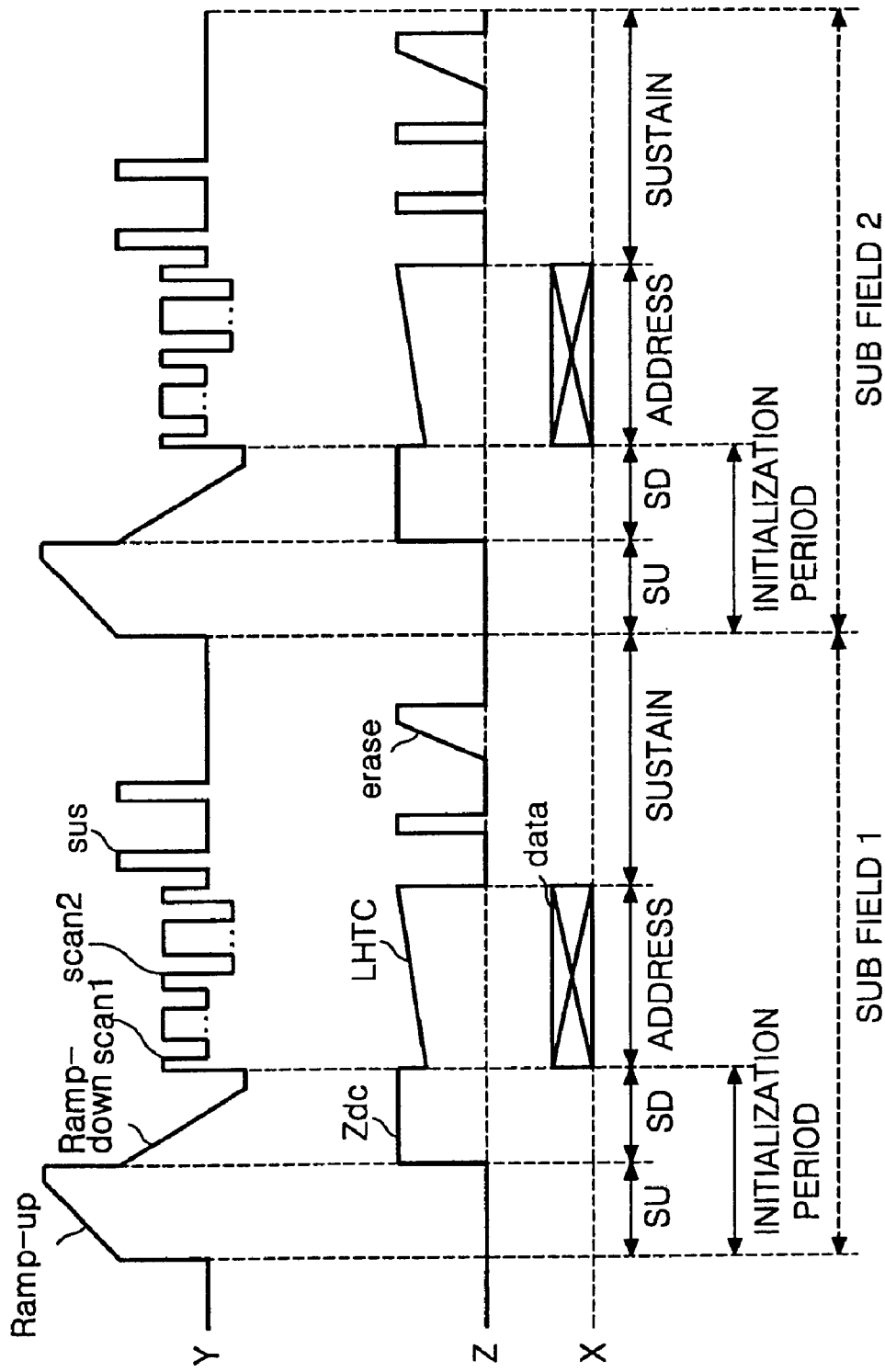
FIG. 18 is a waveform diagram representing a driving method of a PDP according to the twelfth embodiment of the present invention.

FIG. 18 illustrates a driving waveform of a PDP according to the twelfth embodiment of the present invention.

Referring to FIG. 18, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a negative voltage level lower than a ground voltage GND is simultaneously applied to the scan electrodes Y for the set-down period.

During the set-down period SD, the sustain electrode Z is supplied with a positive DC voltage Zdc so that an erasure discharge can be generated between the sustain electrode Z and the scan electrode Y.

In the first half of the address period, a first scan pulse SCAN1 of designated voltage level is sequentially applied to the scan electrodes Y, which come relatively earlier in scanning order. In the second half of the address period, a second scan pulse SCAN2 is sequentially applied to the scan electrodes Y, which come relatively later in scanning order, wherein the second scan pulse SCAN2 has a higher voltage level in a negative direction as compared with the first scan pulse SCAN1. Positive data pulses DATA synchronized with the scan pulses SCAN1, SCAN2 are applied to the address electrodes X. When the voltage difference between the scan pulses SCAN1, SCAN2 and the data pulse DATA is added to the wall voltages generated in the initialization period, the address discharge is generated within the cell to which the data pulse DATA is applied. During the address period, the sustain electrode Z is supplied with a high-temperature compensation voltage LHTC that rises from a voltage level lower than the positive DC voltage Zdc, wherein the positive DC voltage Zdc has been applied for the set-down period SD in consideration of the voltage level of the scan electrode Y that fell to the designated negative potential for the set-down period SD. The second scan pulse SCAN2 and the high-temperature compensation voltage LHTC increase the voltage of the scan electrode Y and the sustain electrode Z at the line where its scanning order is late, thereby increasing the amount of the positive wall charges accumulated in the scan electrode Y and of the negative wall charges accumulated in the sustain electrode Z. The second scan pulse SCAN2 and the high-temperature compensation voltage LHTC cause the wall voltages to be formed within the cell even at the line where its scanning order is late, wherein the wall voltages are capable of generating the discharge when the sustain voltage is applied. The difference between the minimum voltage and the maximum voltage in the high-temperature compensation voltage LHTC and the voltage of the second scan pulse SCAN2 become smaller as compared with the high-temperature compensation voltage LHTC and the second scan pulse SCAN2 shown in FIGS. 8 and 16.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the second scan pulse SCAN2 and the high-temperature compensation voltage LHTC applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 19:
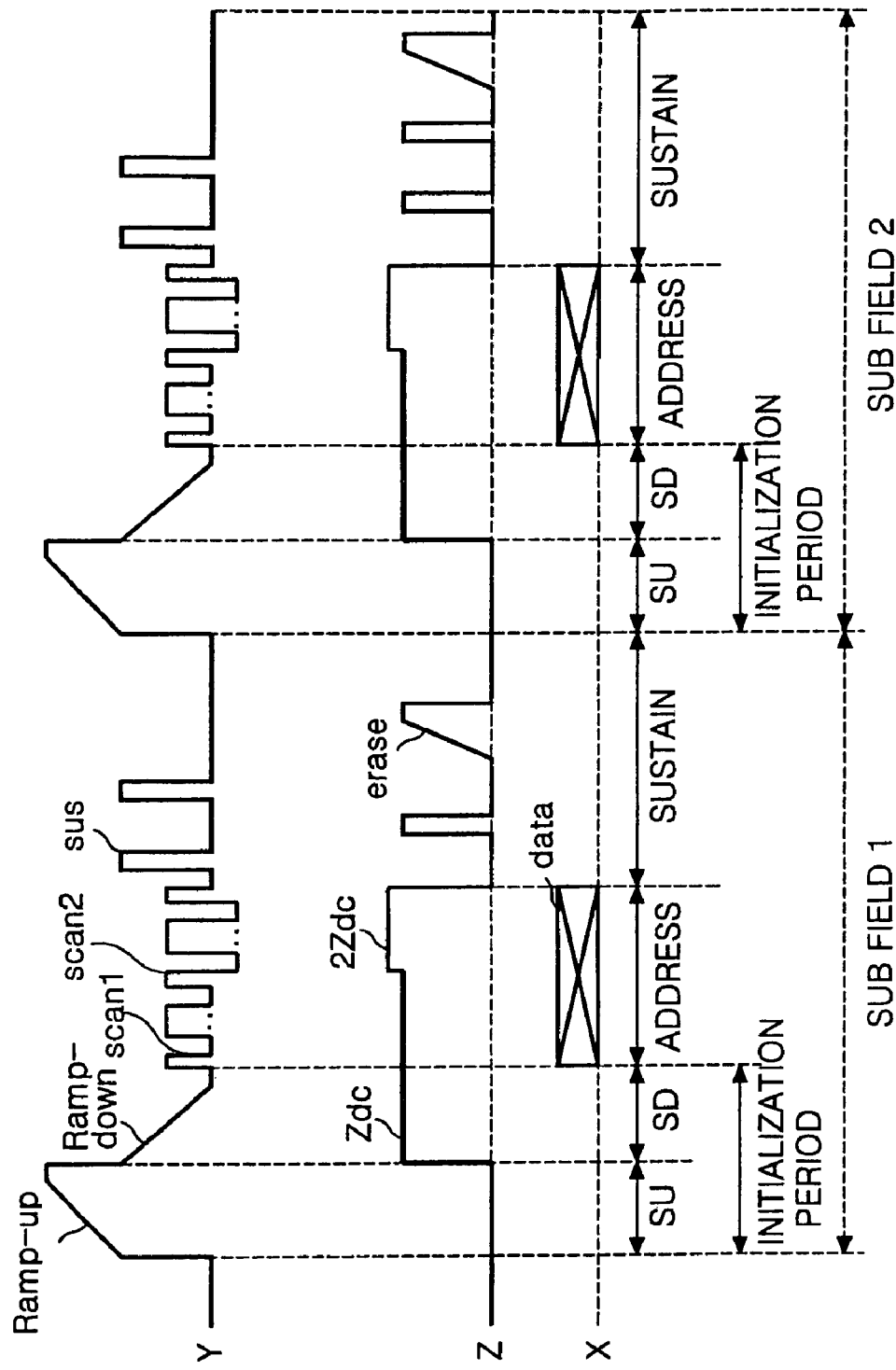
FIG. 19 is a waveform diagram representing a driving method of a PDP according to the thirteenth embodiment of the present invention.

FIG. 19 illustrates a driving waveform of a PDP according to the thirteenth embodiment of the present invention.

Referring to FIG. 19, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a ground voltage GND is simultaneously applied to the scan electrodes Y for the set-down period.

In the first half of the address period, a first scan pulse SCAN1 of designated voltage level is sequentially applied to the scan electrodes Y, which come relatively earlier in scanning order. In the second half of the address period, a second scan pulse SCAN2 is sequentially applied to the scan electrodes Y, which come relatively later in scanning order, wherein the second scan pulse SCAN2 has a higher voltage level in a negative direction as compared with the first scan pulse SCAN1. Positive data pulses DATA synchronized with the scan pulses SCAN1, SCAN2 are applied to the address electrodes X. When the voltage difference between the scan pulses SCAN1, SCAN2 and the data pulse DATA is added to the wall voltages generated in the initialization period, the address discharge is generated within the cell to which the data pulse DATA is applied. During the set-down period SD and the first half of the address period, the sustain electrode Z is supplied with a positive DC voltage Zdc, and then during the second half of the address period, there is applied a second positive DC voltage 2Zdc higher than the positive DC voltage Zdc. The second scan pulse SCAN2 and the second DC voltage 2Zdc increase the voltage of the scan electrode Y and the sustain electrode Z at the lines where their scanning order is relatively late, thereby increasing the amount of the positive wall charges accumulated in the scan electrode Y and of the negative wall charges accumulated in the sustain electrode Z. The second scan pulse SCAN2 and the second positive DC voltage 2Zdc cause the wall voltages to be formed within the cell even at the lines where their scanning order is late, wherein the wall voltages are capable of generating the discharge when the sustain voltage is applied. The second positive DC voltage 2Zdc and the voltage of the second scan pulse SCAN2 become smaller as compared with the second positive DC voltage 2Zdc and the second scan pulse SCAN2 shown in FIGS. 9 and 16.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the second scan pulse SCAN2 and the second positive DC voltage 2Zdc applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

Figure 20:
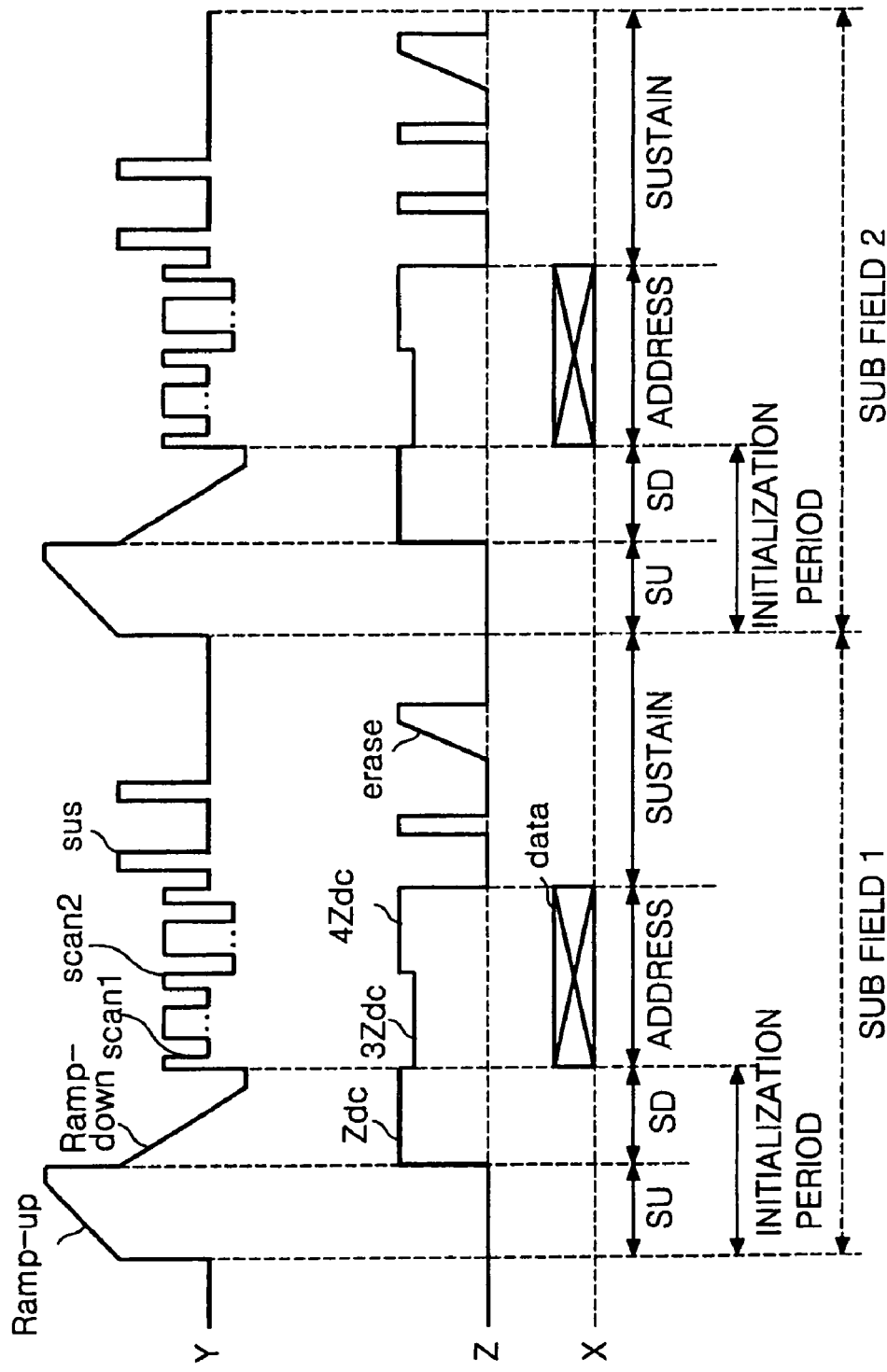
FIG. 20 is a waveform diagram representing a driving method of a PDP according to the fourteenth embodiment of the present invention.

FIG. 20 illustrates a driving waveform of a PDP according to the fourteenth embodiment of the present invention.

Referring to FIG. 20, in the setup period SU of the initialization period, a rising ramp waveform Ramp-up that rises up to a peak voltage higher than a sustain voltage is simultaneously applied to all scan electrodes Y. Subsequently, a falling ramp waveform Ramp-down that falls down to a negative voltage level lower than a ground voltage GND is simultaneously applied to the scan electrodes Y for the set-down period.

In the first half of the address period, a first scan pulse SCAN1 of designated voltage level is sequentially applied to the scan electrodes Y, which come relatively earlier in scanning order. In the second half of the address period, a second scan pulse SCAN2 is sequentially applied to the scan electrodes Y, which come relatively later in scanning order, wherein the second scan pulse SCAN2 has a higher voltage level in a negative direction as compared with the first scan pulse SCAN1. Positive data pulses DATA synchronized with the scan pulses SCAN1, SCAN2 are applied to the address electrodes X. When the voltage difference between the scan pulses SCAN1, SCAN2 and the data pulse DATA is added to the wall voltages generated in the initialization period, the address discharge is generated within the cell to which the data pulse DATA is applied.

During the set-down period SD, the sustain electrode Z is supplied with a positive DC voltage Zdc. And in the first half of the address period, the sustain electrode Z is supplied with a third positive DC voltage 3Zdc that has a lower voltage level than the positive DC voltage Zdc, and then supplied with a fourth positive DC voltage 4Zdc that has a higher voltage level than the third positive DC voltage 3Zdc in the second half of the address period.

During the address period, the second scan pulse SCAN2 and the fourth DC voltage 4Zdc increase the voltage of the scan electrode Y and the sustain electrode Z at the lines where their scanning order is relatively late, thereby increasing the amount of the positive wall charges accumulated in the scan electrode Y and of the negative wall charges accumulated in the sustain electrode Z. The second scan pulse SCAN2 and the second positive DC voltage 2Zdc cause the wall voltages to be formed within the cell even at the lines where their scanning order is late, wherein the wall voltages are capable of generating the discharge when the sustain voltage is applied. The second scan pulse SCAN2 and the third and fourth positive DC voltages 3Zdc, 4Zdc become smaller as compared with the second scan pulse SCAN2 and the third and fourth positive DC voltages 3Zdc, 4Zdc shown in FIGS. 10 and 16.

In the sustain period, sustain pulses SUS are alternately applied to the scan electrodes Y and the sustain electrodes Z. In the cells selected by the address discharge, there occurs a sustain discharge between the scan electrode Y and the sustain electrode Z whenever each sustain pulse SUS is applied as the wall voltage within the cell is added to the sustain pulse SUS. During the address period, because of the second scan pulse SCAN2 and the third and fourth positive DC voltages 3Zdc, 4Zdc applied to the scan electrode Y and the sustain electrode Z respectively, the wall voltages are increased sufficiently at the line where its scanning order is late, thus the sustain discharge is generated stably even at the line where the scanning order is late. After the completion of the sustain discharge, a small ramp waveform ERASE applied to the sustain electrode Z eliminates the wall charges generated upon the sustain discharge.

On the other hand, the foregoing embodiments increase the voltage of the scan electrode Y and the common sustain electrode Z as their scanning order gets later, so as to compensate the mis-discharge caused under the high temperature environment, however it is possible to obtain the same effect by increasing a data voltage or the voltage of the scan electrode and/or the voltage of the sustain electrode together with the data voltage as their scanning order gets later.

As described above, the driving method and apparatus of the PDP according to the present invention, during the address period, can drive the PDP stably under the high temperature environment because the mis-discharge, which occurs under the high temperature environment at the lines where their scanning order is late, can be prevented by increasing the voltage of the scan electrode or the voltage of the sustain electrode as their scanning order gets later.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method for driving a plasma display apparatus that includes a scan electrode and a sustain electrode formed on a first substrate, an address electrode formed on a second substrate, a plurality of barrier ribs provided between the first substrate and the second substrate, and a cell defined by the scan, sustain and address electrodes, and the plurality of barrier ribs, the method comprising:

applying a rising waveform to the scan electrode during a setup period;

applying a falling waveform to the scan electrode during a set-down period;

applying a scan pulse to the scan electrode during an address period, the address period including a first address period and a second address period later than the first address period, wherein each scan pulse of the first address period and the second address period falls from a scan reference voltage having a positive voltage and then rises back to the scan reference voltage having the positive voltage;

applying a first sustain pulse to the scan electrode during a sustain period;

applying a first DC voltage to the sustain electrode during the set-down period;

applying a second DC voltage to the sustain electrode during the first address period after applying the falling waveform to the scan electrode;

applying a third DC voltage to the sustain electrode during the second address period after applying the second DC voltage to the sustain electrode; and applying a second sustain pulse to the sustain electrode during the sustain period;

wherein the rising waveform increases to a voltage greater than a peak voltage of the first sustain pulse, and the falling waveform decreases to a voltage less than a ground voltage, and wherein a difference between the third DC voltage and a lowest voltage of the scan pulse applied during the second address period is more than a difference between the second DC voltage and a lowest voltage of the scan pulse applied during the first address period.

2. The method of claim 1, wherein the first DC voltage is substantially equal to the second DC voltage.

3. The method of claim 1, wherein the second DC voltage is less than the peak voltage of the first sustain pulse.

4. The method of claim 1, wherein the third DC voltage is substantially equal to the peak voltage of the first sustain pulse.

5. The method of claim 1, wherein a lowest voltage of the falling waveform is different from a lowest voltage of the scan pulse.

6. The method of claim 1, wherein the first sustain pulse is applied to the scan electrode after the second sustain pulse is applied to the sustain electrode during the sustain period.

7. The method of claim 1, wherein the scan pulse is applied to the scan electrode from a predetermined voltage greater than the ground voltage to a negative voltage.

8. The method of claim 7, wherein the predetermined voltage is less than the peak voltage of the first sustain pulse.

9. The method of claim 1, wherein the first sustain pulse is applied to the scan electrode before the second sustain pulse is applied to the sustain electrode, and the first sustain pulse and the second sustain pulse are applied in a same subfield.

10. The method of claim 1, wherein the falling waveform gradually decreases to a voltage less than a ground voltage.

11. The method of claim 1, wherein the rising waveform gradually increases to a voltage greater than the peak voltage of the first sustain pulse.

12. The method of claim 1, wherein the setup period and the set-down period are provided within one subfield, and the address period and sustain period are also provided within the one subfield.

13. The method of claim 12, wherein the one subfield is a first subfield of a frame.

14. The method of claim 1, wherein the second DC voltage and the third DC voltage are applied during a temperature environment of 50° C. or greater.

15. The method of claim 1, wherein the second DC voltage is less than the third DC voltage.

16. The method of claim 1, wherein the voltage of the scan pulse applied to the scan electrode during the second DC voltage applied to the sustain electrode is higher than the voltage of the scan pulse applied to the scan electrode during the third DC voltage applied to the sustain electrode.

17. A method for driving a plasma display apparatus that includes a scan electrode and a sustain electrode formed on a first substrate, an address electrode formed on a second substrate, a plurality of barrier ribs provided between the first substrate and the second substrate, and a cell defined by the scan, sustain and address electrodes, and the plurality of barrier ribs, the method comprising:

applying a rising waveform to the scan electrode during a setup period;

applying a falling waveform to the scan electrode during a set-down period;

applying a scan pulse to the scan electrode during an address period, the address period including a first address period and a second address period later than the first address period, wherein each scan pulse of the first address period and the second address period falls from a scan reference voltage having a positive voltage and then rises back to the scan reference voltage having the positive voltage;

applying a first sustain pulse to the scan electrode during a sustain period;

applying a first DC voltage to the sustain electrode during the set-down period;

applying a second DC voltage to the sustain electrode during the first address period after applying the falling waveform to the scan electrode;

applying a third DC voltage to the sustain electrode during the second address period after applying the falling waveform to the scan electrode; and applying a second sustain pulse to the sustain electrode during the sustain period, wherein the rising waveform increases to a voltage greater than a peak voltage of the first sustain pulse, and the falling waveform decreases to a voltage less than a ground voltage, wherein a difference between the third DC voltage and a lowest voltage of the scan pulse applied during the second address period is more than a difference between the second DC voltage and a lowest voltage of the scan pulse applied during the first address period.

18. The method of claim 17, wherein a peak voltage of the second DC voltage is less than a peak voltage of the first sustain pulse, and a peak voltage of the third DC voltage is substantially equal to a peak voltage of the first sustain pulse.

19. The method of claim 17, wherein the third DC voltage is applied to the sustain electrode when the scan pulse is applied to the scan electrode, and wherein a peak voltage of the third DC voltage is greater than a peak voltage of the second DC voltage.

20. The method of claim 19, wherein the third DC voltage is applied to the sustain electrode after the second DC voltage is applied to the sustain electrode.

21. The method of claim 17, wherein a lowest voltage of the falling waveform is different from a lowest voltage of the scan pulse.

22. The method of claim 17, wherein the setup period and the set-down period are provided within one subfield, and the address period and sustain period are also provided within the one subfield.

23. The method of claim 22, wherein the one subfield is a first subfield of a frame.

24. The method of claim 17, wherein the second DC voltage and the third DC voltage are applied during a temperature environment of 50° C. or greater.

25. A method for driving a plasma display apparatus comprising:

applying a rising waveform to a scan electrode during a setup time of a reset period of one sub-field, the rising waveform increasing to a voltage greater than a prescribed voltage;

applying a falling waveform to the scan electrode during a set-down time of the reset period of the one sub-field, the falling waveform decreasing to a voltage below ground;

applying a scan pulse to the scan electrode during an address period of the one sub-field, the address period including a first address period and a second address period later than the first address period, wherein each scan pulse of the first address period and the second address period falls from a scan reference voltage having a positive voltage and then rises back to the scan reference voltage having the positive voltage;

applying a first sustain pulse to the scan electrode during a sustain period of the one sub-field, the first sustain pulse having a peak voltage of the prescribed voltage;

applying a first DC voltage to a sustain electrode during the set-down time;

applying a second DC voltage to the sustain electrode during the first address period;

applying a third DC voltage to the sustain electrode during the second address period, wherein the second DC voltage is applied to the sustain electrode after the first DC voltage is applied and prior to the third DC voltage being applied to the sustain electrode; and applying a second sustain pulse to the sustain electrode during the sustain period, wherein a difference between the third DC voltage and a lowest voltage of the scan pulse applied during the second address period is more than a difference between the second DC voltage and a lowest voltage of the scan pulse applied during the first address period.

26. The method of claim 25, wherein the third DC voltage is applied to the sustain electrode during the address period.

27. The method of claim 25, wherein the third DC voltage is applied to the sustain electrode after the falling waveform is applied to the scan electrode.

28. The method of claim 25, wherein the first DC voltage is substantially equal to the second DC voltage.

29. The method of claim 25, wherein the second DC voltage is less than the prescribed voltage.

30. The method of claim 25, wherein the third DC voltage is substantially equal to the prescribed voltage.

31. The method of claim 25, wherein a peak voltage of the second DC voltage is less than a peak voltage of the first sustain pulse, and a peak voltage of the third DC voltage is substantially equal to a peak voltage of the first sustain pulse.

32. The method of claim 25, wherein the third DC voltage is applied to the sustain electrode when the scan pulse is applied to the scan electrode, and wherein a peak voltage of the third DC voltage is greater than a peak voltage of the second DC voltage.

33. A method for driving a plasma display apparatus that includes a scan electrode and a sustain electrode formed on a first substrate, an address electrode formed on a second substrate, a plurality of barrier ribs provided between the first substrate and the second substrate, and a cell defined by the scan, sustain and address electrodes, and the plurality of barrier ribs, the method comprising:

applying a rising waveform to the scan electrode during a setup period;

applying a falling waveform to the scan electrode during a set-down period;

applying scan pulses to the scan electrode during an address period, the scan pulses including a first scan pulse, a second scan pulse, a third scan pulse and a fourth scan pulse, each of the first scan pulse, the second pulse, the third scan pulse, and the fourth scan pulse falls from a scan reference voltage having a positive voltage and then rises back to the scan reference voltage having the positive voltage;

applying a first sustain pulse to the scan electrode during a sustain period;

applying a first DC voltage to the sustain electrode during the set-down period;

applying a second DC voltage to the sustain electrode during a first address period included in the address period after applying the falling waveform to the scan electrode;

applying a third DC voltage to the sustain electrode during a second address period included in the address period after applying the second DC voltage to the sustain electrode; and applying a second sustain pulse to the sustain electrode during the sustain period;

wherein the rising waveform increases to a voltage greater than a peak voltage of the first sustain pulse, and the falling waveform decreases to a voltage less than a ground voltage, wherein the second DC voltage is lower than the third DC voltage, wherein the second scan pulse from among the scan pulses is applied after the first scan pulse, the third scan pulse from among the scan pulses is applied after the second scan pulse, the fourth scan pulse from among the scan pulses is applied after the third scan pulse, wherein the voltage of the sustain electrode is maintained at the second DC voltage while the first scan pulse and the second scan pulse are applied to the scan electrode, and the voltage of the sustain electrode is maintained at the third DC voltage while the third scan pulse and the fourth scan pulse are applied to the scan electrode, wherein a difference between the third DC voltage and a lowest voltage of one of the third scan pulse and the fourth scan pulse is more than a difference between the second DC voltage and a lowest voltage of the scan pulse applied during the first address period.

* * * * *

UNITED STATES PATENT AND TRADEMARK OFFICE
CERTIFICATE OF CORRECTION

| | | |
|---|---|---|
| PATENT NO. | : 8,054,248 B2 | Page 1 of 1 |
| APPLICATION NO. | : 11/958455 | |
| DATED | : November 8, 2011 | |
| INVENTOR(S) | : Moon Shick Chung et al. | |

It is certified that error appears in the above-identified patent and that said Letters Patent is hereby corrected as shown below:

Title Page, Please insert:

--Related U.S. Application Data

(63) Continuation of application No. 10/378,617, filed on March 5, 2003, now Pat. No. 7,333,075.

(30) Foreign Application Priority Data

Mar. 6, 2002    (KR)         P2002-12001--

Signed and Sealed this
Twenty-fourth Day of January, 2012

David J. Kappos
*Director of the United States Patent and Trademark Office*